US012770665B2

(12) United States Patent
Shibata et al.

(10) Patent No.: US 12,770,665 B2
(45) Date of Patent: Oct. 20, 2026

(54) MAGNETIC RECORDING ARRAY, PRODUCT-SUM CALCULATOR, AND NEUROMORPHIC DEVICE

(71) Applicant: TDK CORPORATION, Tokyo (JP)

(72) Inventors: Tatsuo Shibata, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1140 days.

(21) Appl. No.: 17/408,707

(22) Filed: Aug. 23, 2021

(65) Prior Publication Data

US 2021/0383853 A1 Dec. 9, 2021

Related U.S. Application Data

(63) Continuation-in-part of application No. PCT/JP2019/007252, filed on Feb. 26, 2019.

(51) Int. Cl.
*G11C 11/16* (2006.01)
*G06F 7/544* (2006.01)
*H10B 61/00* (2023.01)

(52) U.S. Cl.
CPC .......... *G11C 11/161* (2013.01); *G06F 7/5443* (2013.01); *G11C 11/1673* (2013.01); *H10B 61/00* (2023.02)

(58) Field of Classification Search
CPC ..................................................... G06F 7/5443
See application file for complete search history.

(56) References Cited

U.S. PATENT DOCUMENTS 8,120,950 B2 * 2/2012 Fukami .............. G11C 19/0808 365/158
8,559,214 B2 * 10/2013 Fukami .............. G11C 19/0808 365/158
(Continued)

FOREIGN PATENT DOCUMENTS

JP 5160304 B2 3/2013
JP 5206414 B2 6/2013
(Continued)

OTHER PUBLICATIONS

Shiino, Takayuki, et al. "Antiferromagnetic Domain Wall Motion Driven by Spin-Orbit Torques." Physical Review Letters, vol. 117, No. 8, Aug. 2016. Crossref, https://doi.org/10.1103/physrevlett.117.087203. (Year: 2016).*
(Continued)

*Primary Examiner* — James Trujillo
*Assistant Examiner* — Markus Anthony Villanueva
(74) *Attorney, Agent, or Firm* — Oliff PLC

(57) ABSTRACT

A magnetic recording array includes domain wall motion elements and wirings, the domain wall motion elements includes first, second, and third elements, each having a magnetic wall motion layer with first and second end portions, the second element has the second end portion closest to the first end portion of the first element, the third element has the second end portion closest or second closest to the first end portion of the first element, a first distance between the first end portion of the first element and the second end portion of the second element and a second distance between the first end portion of the first element and the second end portion of the third element are shorter than a third distance between the first end portion of the first element and the first end portion closest to the first end portion of the first element.

11 Claims, 17 Drawing Sheets

(56) References Cited

U.S. PATENT DOCUMENTS

| | | | | |
|---|---|---|---|---|
| 8,902,644 | B2 * | 12/2014 | Sakimura | G11C 11/1655 365/158 |
| 2006/0221674 | A1 * | 10/2006 | Braun | G11C 11/16 365/158 |
| 2008/0204946 | A1 * | 8/2008 | Ochiai | G11C 19/0808 360/324.12 |
| 2009/0296454 | A1 | 12/2009 | Honda et al. | |
| 2010/0110777 | A1 * | 5/2010 | Katou | H10B 61/22 365/158 |
| 2010/0142264 | A1 * | 6/2010 | Numata | G11C 19/0808 365/171 |
| 2010/0214826 | A1 * | 8/2010 | Fukami | G11C 11/1675 365/158 |
| 2013/0182501 | A1 | 7/2013 | Sakimura et al. | |
| 2017/0077177 | A1 | 3/2017 | Shimomura et al. | |
| 2018/0301199 | A1 | 10/2018 | Sasaki | |
| 2018/0350432 | A1 | 12/2018 | Sasaki | |
| 2019/0074044 | A1 * | 3/2019 | Atulasimha | G11C 11/5607 |
| 2019/0171418 | A1 | 6/2019 | Morie et al. | |
| 2019/0189516 | A1 | 6/2019 | Sasaki et al. | |

FOREIGN PATENT DOCUMENTS

| | | | |
|---|---|---|---|
| JP | 5846124 | B2 | 1/2016 |
| JP | 6089081 | B1 | 3/2017 |
| JP | 2018-182291 | A | 11/2018 |
| JP | 2019-029595 | A | 2/2019 |
| WO | 2012/081453 | A1 | 6/2012 |
| WO | 2017/183573 | A1 | 10/2017 |
| WO | 2018/034163 | A1 | 2/2018 |
| WO | 2018/189964 | A1 | 10/2018 |

OTHER PUBLICATIONS

Gnawali, Krishna Prasad et al. "Low Power Spintronic Ternary Content Addressable Memory." IEEE Transactions on Nanotechnology 17 (2018): 1206-1216. (Year: 2018).*

Anonymous, "between definition". Accessed Apr. 28, 2025. Oxford Learner's Dictionaries. https://www.oxfordlearnersdictionaries.com/definition/english/between_2 (Year: 2025).*

Guchang Han, Michael Tran, Cheow Hin Sim, Jacob Chenchen Wang, Kwaku Eason, Sze Ter Lim, Aihong Huang; Control of offset field and pinning stability in perpendicular magnetic tunnelling junctions with synthetic antiferromagnetic coupling multilayer. J. Appl. Phys. May 7, 2015; 117 (17): 17B515. (Year: 2015).*

Geoffrey W. Burr et al., "Neuromorphic computing using non-volatile memory," Advances in Physics: X, 2017, vol. 2, No. 1, 89-124.

P. Narayanan et al., "Toward on-chip acceleration of the backpropagation algorithm using nonvolatile memory," IBM J. Res. & Dev., vol. 61, No. 4/5, Paper 11, 2017.

May 7, 2019 International Search Report issued in International Patent Application No. PCT/JP2019/007252.

* cited by examiner

MAGNETIC RECORDING ARRAY, PRODUCT-SUM CALCULATOR, AND NEUROMORPHIC DEVICE

TECHNICAL FIELD

The present invention relates to a magnetic recording array, a product-sum calculator and a neuromorphic device.

BACKGROUND ART

Neural network techniques are being studied. A neural network is a network that imitates the human nervous system and is beginning to be used in a wide range of fields. A neural network usually requires a huge amount of product-sum calculations.

An example of a neural network have a multi-layer perceptron structure consisting of an input layer, a hidden layer, and an output layer. A plurality of pieces of data input to the input layer are given individual weights and integrated. A sum of the integrated data is input to an activation function and finally output from the output layer. A neuromorphic device is a device that imitates a brain mechanism. A neuromorphic device can implement a neural network with hardware. In a case in which a neuromorphic device is reproduced with an analog-based device, a memristor (a variable resistance element) is used for a part that gives weights to data. A spin memristor is known as an example of a memristor (for example, Patent Literature 1). A domain wall motion element that utilizes domain wall motion is an example of a spin memristor.

A domain wall motion element is an example of an element capable of giving weights to data, and a plurality of domain wall motion elements are often integrated and used. In order to achieve reduction in size of the entire magnetic memory, it is required to improve the integration of domain wall motion elements. For example, Patent Literature 2 discloses that, in order to inhibit an increase in an occupied area of a memory cell, a non-magnetic layer is disposed obliquely with respect to a write word line, a write bit line, a read word line, and a read bit line.

CITATION LIST

Patent Literature

[Patent Literature 1]
International Publication No. 2017/183573
[Patent Literature 2]
Japanese Patent No. 6089081

SUMMARY OF INVENTION

Technical Problem

Patent Literature 2 discloses that a non-magnetic layer is disposed obliquely with respect to wiring, so that an occupied area of a memory cell can be reduced. However, when domain wall motion elements are arranged in the same arrangement, the domain wall motion elements have domain wall motion layers in which orientation directions of magnetization are different between a first end portion and a second end portion, and thus repulsion of magnetic poles may occur between the first end portion and the second end portion and stability of magnetization may decrease.

The present invention has been made in view of the above problems, and an object of the present invention is to provide a magnetic recording array, a product-sum calculator, and a neuromorphic device that are magnetically stable and have improved controllability.

Solution to Problem (1) A magnetic recording array according to a first aspect includes: a plurality of domain wall motion elements and a plurality of wirings, the plurality of domain wall motion elements has a first element array arranged in a first direction and a second element array arranged in a second direction different from the first direction, each of the plurality of domain wall motion elements includes: a first ferromagnetic layer; a domain wall motion layer which extends in a direction different from the first direction and the second direction and in which an orientation direction of magnetization in a first end portion and an orientation direction of magnetization in a second end portion are different from each other; a non-magnetic layer located between the first ferromagnetic layer and the domain wall motion layer; a first conductive portion facing the first end portion of the domain wall motion layer; and a second conductive portion facing the second end portion of the domain wall motion layer, the plurality of wirings include: a first wiring connected over the first ferromagnetic layers of some of the plurality of domain wall motion elements; a second wiring connected over the first conductive portions of some of the plurality of domain wall motion elements; and a third wiring connected over the second conductive portions of some of the plurality of domain wall motion elements, and the plurality of domain wall motion elements has a first element, a second element and a third element, the third element has the second end portion closest or second closest to the first end portion of the first element, a first distance between the first end portion of the first element and the second end portion of the second element and a second distance between the first end portion of the first element and the second end portion of the third element are shorter than a third distance between the first end portion of the first element and the first end portion closest to the first end portion of the first element.

(2) In the magnetic recording array according to the above aspect, at least one of the first conductive portion and the second conductive portion may contain a magnetic material.

(3) In the magnetic recording array according to the above aspect, each of the domain wall motion layers is tilted at an angle larger than 0 degrees and smaller than 45 degrees with respect to the first direction, and the number of the domain wall motion elements constituting the first element array is smaller than the number of the domain wall motion elements constituting the second element array.

(4) In the magnetic recording array according to the above aspect, each of the domain wall motion layers is tilted at an angle larger than 45 degrees and smaller than 90 degrees with respect to the first direction, and the number of the domain wall motion elements constituting the first element array is larger than the number of the domain wall motion elements constituting the second element array.

(5) The magnetic recording array according to the above aspect may have a first transistor and a second transistor, the first transistor is located between the first ferromagnetic layer of the domain wall motion element and the first wiring; and the second transistor is located between the first conductive portion of the domain wall motion element and the second wiring.

(6) The magnetic recording array according to the above aspect may further have a third transistor which is located between the second conductive portion of the domain wall motion elements and the third wiring.

(7) In the magnetic recording array according to the above aspect, the first wiring and the second wiring may be parallel to each other.

(8) In the magnetic recording array according to the above aspect, the first wiring and the second wiring may intersect each other.

(9) A product-sum calculator according to a second aspect includes the magnetic recording array according to the above aspect, a sum calculation unit connected to the plurality of domain wall motion elements belonging to the first element array of the magnetic recording array, and a peripheral circuit disposed around the magnetic recording array, and the peripheral circuit includes a first power supply connected to the first wiring and a second power supply connected to the second wiring.

(10) In the product-sum calculator according to the above aspect, the peripheral circuit may further include a control unit, the sum calculation unit may further include a detector, the control unit is connected to the detector, and the control unit controls the detector to detect a total current amount of an electric current flowing through the third wiring, which is commonly connected to the one first element array, during a period from when a read current is applied to all the domain wall motion elements disposed in the first element array to when the read current is not applied.

(11) A neuromorphic device according to a third aspect includes one or a plurality of product-sum calculators according to the above aspect.

Advantageous Effects of Invention

According to the magnetic recording array, the product-sum calculator, and the neuromorphic device according to the above aspects, it is possible to increase magnetic stability and improve controllability.

DESCRIPTION OF EMBODIMENTS

Figure 1:
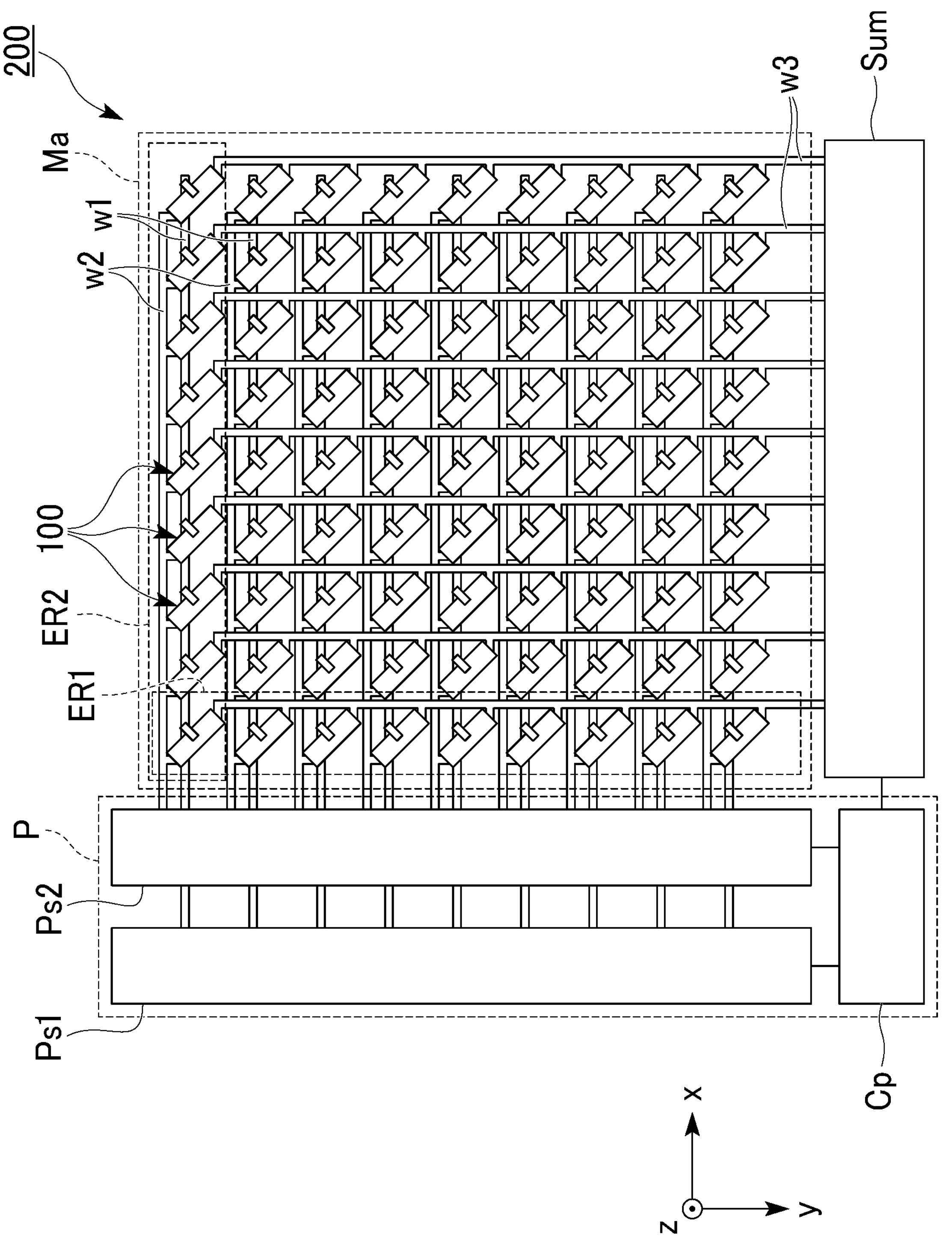
FIG. 1 is a schematic view of a product-sum calculator according to a first embodiment.

Hereinafter, the present embodiment will be appropriately described in detail with reference to the drawings. In the drawings used in the following description, featured portions may be shown enlarged for convenience in order to make features of the present invention easy to understand, and dimensional ratios and the like of each constitutional element may differ from those of actual ones. Materials, dimensions, and the like exemplified in the following description are examples, and the present invention is not limited thereto and can be appropriately modified and carried out within the range in which the effects of the present invention can be achieved.

Directions will be defined. An x direction and a y direction are two directions in which domain wall motion elements 100, which will be described later, are arranged. For example, in a case in which the domain wall motion elements 100 are arranged in a matrix, a direction in which rows are formed is the x direction, and a direction in which columns are formed is the y direction. The y direction is an example of a "first direction," and the x direction is an example of a "second direction." A z direction is a direction orthogonal to the x direction and the y direction, and is, for example, a direction oriented from a domain wall motion layer 20, which will be described later, toward a first ferromagnetic layer 10.

Further, in the present specification, "connection" is not limited to the case of physical connection and may also include the case of electrical connection. As used herein, the term "facing" means a relationship in which two layers face each other, whether in contact with each other or with another layer therebetween. In the present specification, "extending in an A direction" means that, for example, a dimension in the A direction is larger than the smallest dimension of dimensions in an X direction, a Y direction, and a Z direction, which will be described later. The "A direction" is an arbitrary direction.

First Embodiment

FIG. 1 is a schematic view of a product-sum calculator 200 according to a first embodiment. The product-sum calculator 200 includes a magnetic recording array Ma, a sum calculation unit Sum, and a peripheral circuit P.

The magnetic recording array Ma has a plurality of domain wall motion elements 100 and a plurality of wirings (first wiring w1, second wiring w2, and third wiring w3). The magnetic recording array Ma is a part for performing a product calculation. The magnetic recording array Ma is an example of a product calculation unit.

The plurality of domain wall motion elements 100 are arranged in a matrix arrangement, for example. Hereinafter, an aggregate of the domain wall motion elements 100 arranged in a column direction will be referred to as a first element array ER1, and an aggregate of the domain wall motion elements 100 arranged in a row direction will be referred to as a second element array ER2. The first element array ER1 is lined up in the row direction, and the second element array ER2 is lined up in the column direction. The plurality of domain wall motion elements 100 are respectively connected by the plurality of wirings (the first wiring w1, the second wiring w2, and the third wirings w). The first wiring w1, the second wiring w2, and the third wiring w3 are connected over the plurality of domain wall motion elements 100. The plurality of domain wall motion elements 100 belonging to the first element array ER1 are connected to each other by, for example, the third wirings w3. The plurality of domain wall motion elements 100 belonging to the second element array ER2 are connected to each other by, for example, the first wiring w1 and the second wiring w2.

The sum calculation unit Sum is a part for performing sum calculation. The sum calculation unit Sum is connected to each of the plurality of domain wall motion elements 100 belonging to the first element array ER1. The sum calculation unit Sum is connected to each of the third wirings w3. The sum calculation unit Sum has, for example, a detector. The detector is controlled by, for example, a control unit Cp, which will be described later. The detector is connected to, for example, each of the third wirings w3 and is electrically connected to all of the domain wall motion elements 100 belonging to the first element array ER1. The detector detects, for example, a total current amount of an electric current flowing through one third wiring w3 during a period from when a read current is applied to all the domain wall motion elements 100 disposed in one first element array ER1 until the read current is not applied. The currents flowing through each of the domain wall motion elements 100 forming the first element row ER1 merge in the third wiring w3, the summation operation of the sum-of-products arithmetic unit 200 is performed.

The peripheral circuit P is a part for controlling the magnetic recording array Ma that performs the product calculation and the sum calculation unit Sum. The peripheral circuit P has, for example, a first power supply Ps1, a second power supply Ps2, and the control unit Cp.

The first power supply Ps1 is connected to, for example, each of the first wirings w1. The first power supply Ps1 supplies a read current to each of the domain wall motion elements 100. The second power supply Ps2 is connected to each of the second wirings w2, for example. The second power supply Ps2 supplies a write current to each of the domain wall motion elements 100.

The control unit Cp is connected to, for example, the first power supply Ps1, the second power supply Ps2, and the sum calculation unit Sum. The control unit Cp controls, for example, operations of the first power supply Ps1, the second power supply Ps2, and the sum calculation unit Sum. For example, the control unit Cp controls the first power supply Ps1 to simultaneously apply the read current to the plurality of first wirings w1 connected to the plurality of domain wall motion elements 100 disposed in the first element array ER1. Information on the domain wall motion elements 100 belonging to the first element array ER1 is collectively sent to the sum calculation unit Sum via the third wiring w3. For example, the control unit Cp controls the second power supply Ps2 to simultaneously apply the write current to the plurality of second wirings w2 connected to the plurality of domain wall motion elements 100 disposed in the first element array ER1. Information is written to the plurality of domain wall motion elements 100 belonging to the first element array ER1 at the same time.

Figure 2:
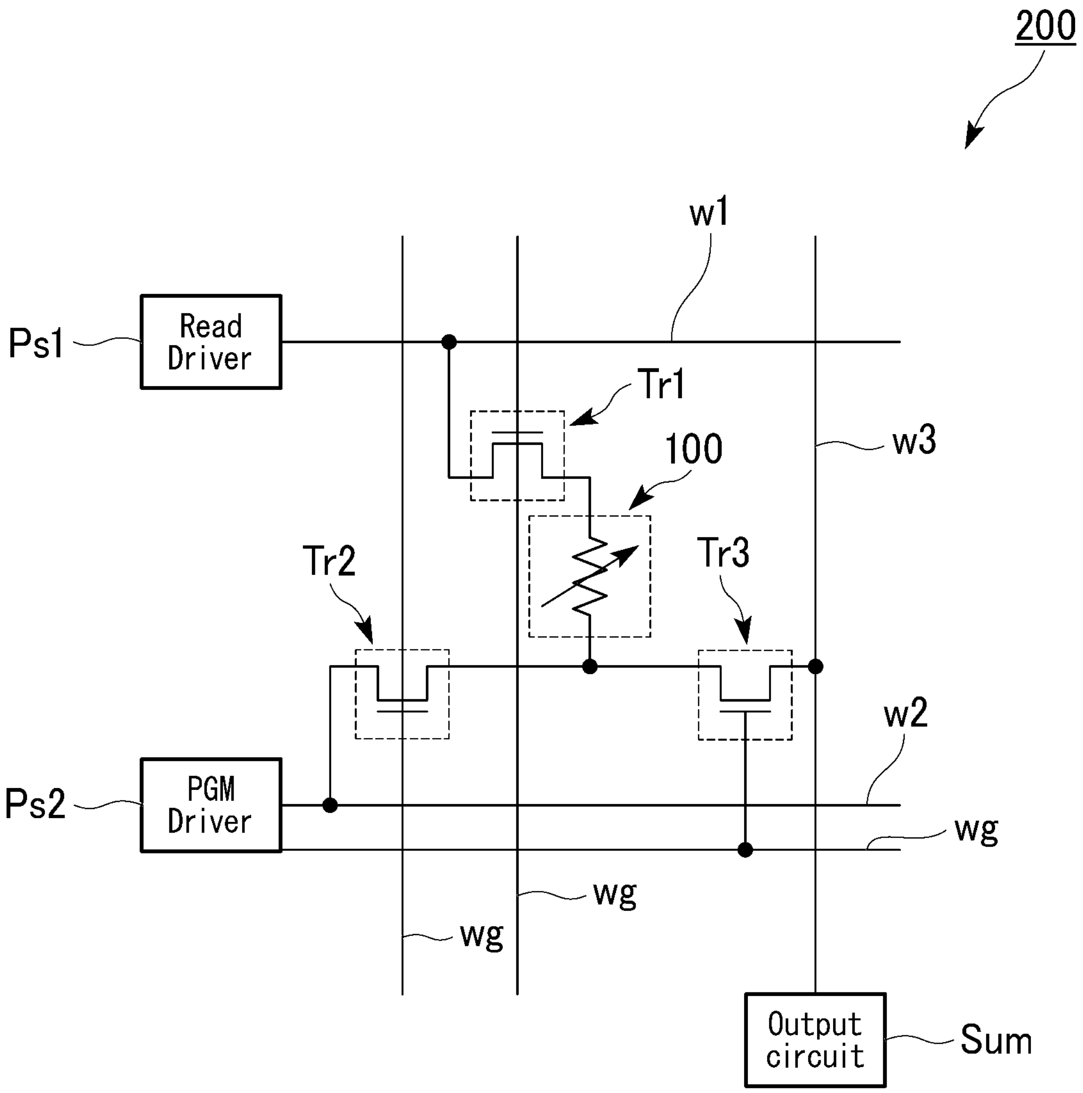
FIG. 2 is an enlarged circuit diagram of a periphery of one domain wall motion element constituting the product-sum calculator according to the first embodiment.
Figure 3:
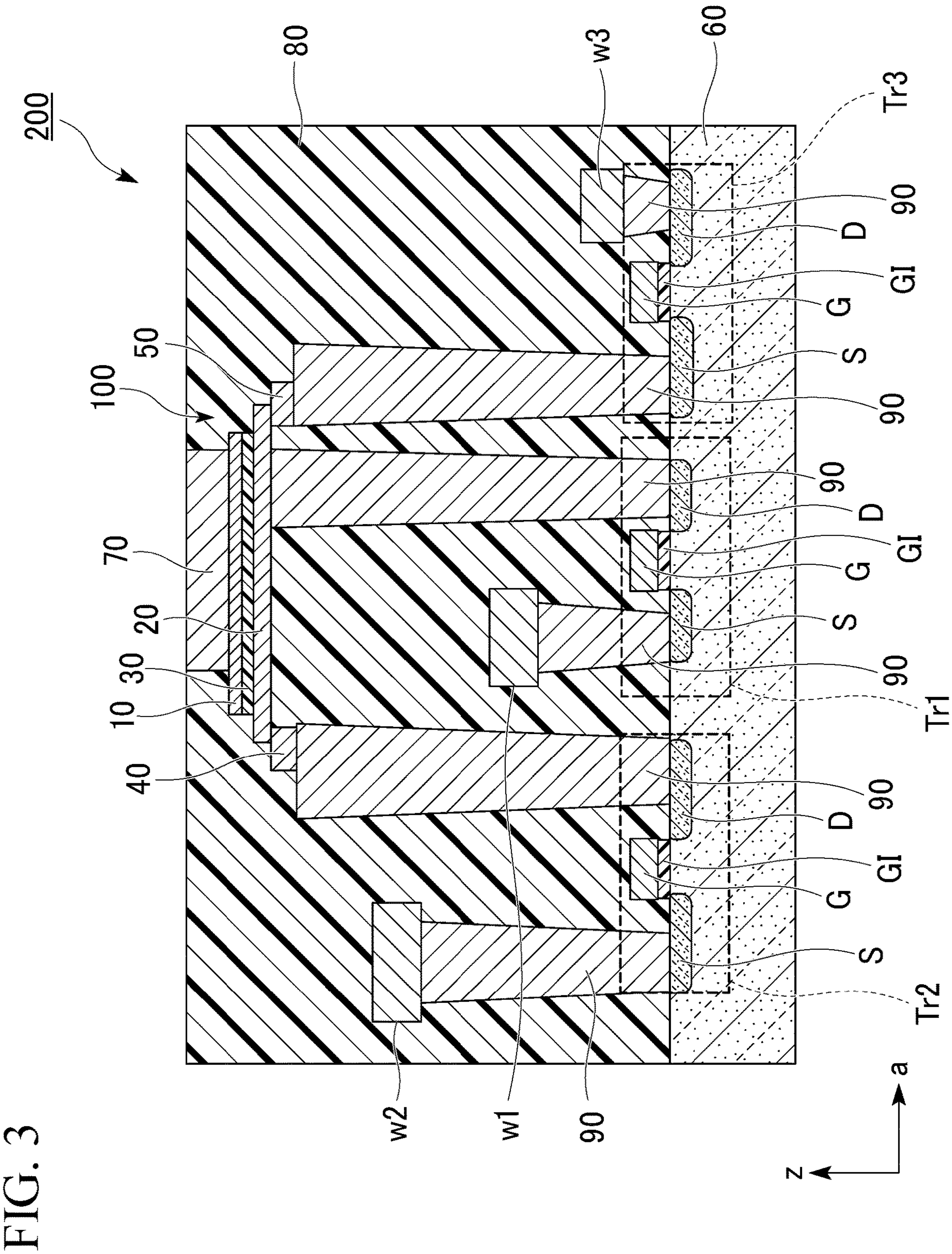
FIG. 3 is an enlarged cross-sectional view of the periphery of the one domain wall motion element constituting the product-sum calculator according to the first embodiment.

FIG. 2 is an enlarged circuit diagram of a periphery of one domain wall motion element 100 constituting the product-sum calculator 200 according to the first embodiment. FIG. 3 is an enlarged cross-sectional view of the periphery of the one domain wall motion element 100 constituting the product-sum calculator 200 according to the first embodiment. FIG. 3 is a cross-sectional view along a domain wall motion layer 20 of the domain wall motion element 100. Hereinafter, an extending direction of the domain wall motion layer 20 will be referred to as "a direction."

The domain wall motion element 100 shown in FIG. 2 is connected to the first wiring w1, the second wiring w2, and the third wiring w3 via transistors (a first transistor Tr1, a second transistor Tr2, and a third transistor Tr3).

As shown in FIG. 3, the first wiring w1, the second wiring w2, the third wiring w3, and the domain wall motion element 100 are each insulated by an interlayer insulating film 80 except for via wiring 90.

The interlayer insulating film 80 is an insulating layer that insulates between wirings of multilayer wiring and between elements. The interlayer insulating film 80 is, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$), or the like. The via wiring 90 is wiring for connecting the first transistor Tr1 to the first wiring w1, the first transistor Tr1 to the domain wall motion element 100, the second transistor Tr2 to the second wiring w2, the second transistor Tr2 to the domain wall motion element 100, the third transistor Tr3 to the third wiring w3, and the third transistor Tr3 to the domain wall motion element 100. The via wiring 90 connected to the first transistor Tr1 is connected to the electrode 70 on the depth side of the paper. The via wiring 90 is made of, for example, a conductive material.

The first wiring w1 is connected to the first power supply Ps1, and a read current applied to the domain wall motion element 100 flows therein. The second wiring w2 is connected to the second power supply Ps2, and a write current applied to the domain wall motion element 100 flows therein. The third wiring w3 is connected to the sum calculation unit Sum, and both the write current and the read current flow therein. The third wiring w3 may be referred to as a common wiring. For example, the first wiring w1 and the second wiring w2 are parallel. For example, the third wiring w3 is orthogonal to the first wiring w1 and the second wiring w2.

The first transistor Tr1 is located between the first wiring w1 and the domain wall motion element 100. The first transistor Tr1 controls the read current applied to the domain wall motion element 100. The second transistor Tr2 is located between the second wiring w2 and the domain wall motion element 100. The second transistor Tr2 controls the write current applied to the domain wall motion element 100. The third transistor Tr3 is located between the third wiring w3 and the domain wall motion element 100. The third transistor Tr3 controls the write current and the read current applied to the domain wall motion element 100.

The first transistor Tr1, the second transistor Tr2, and the third transistor Tr3 are field effect transistors each having a source region S, a drain region D, a gate insulating film GI, and a gate electrode G. A plurality of source regions S and a plurality of drain regions D are regions formed by doping impurities into a substrate 60. The substrate 60 is, for example, a semiconductor substrate. The gate electrodes G are connected to gate wiring wg (see FIG. 2). The gate wiring wg is wiring for applying a voltage to the gate electrodes G of the transistors.

Figure 4:
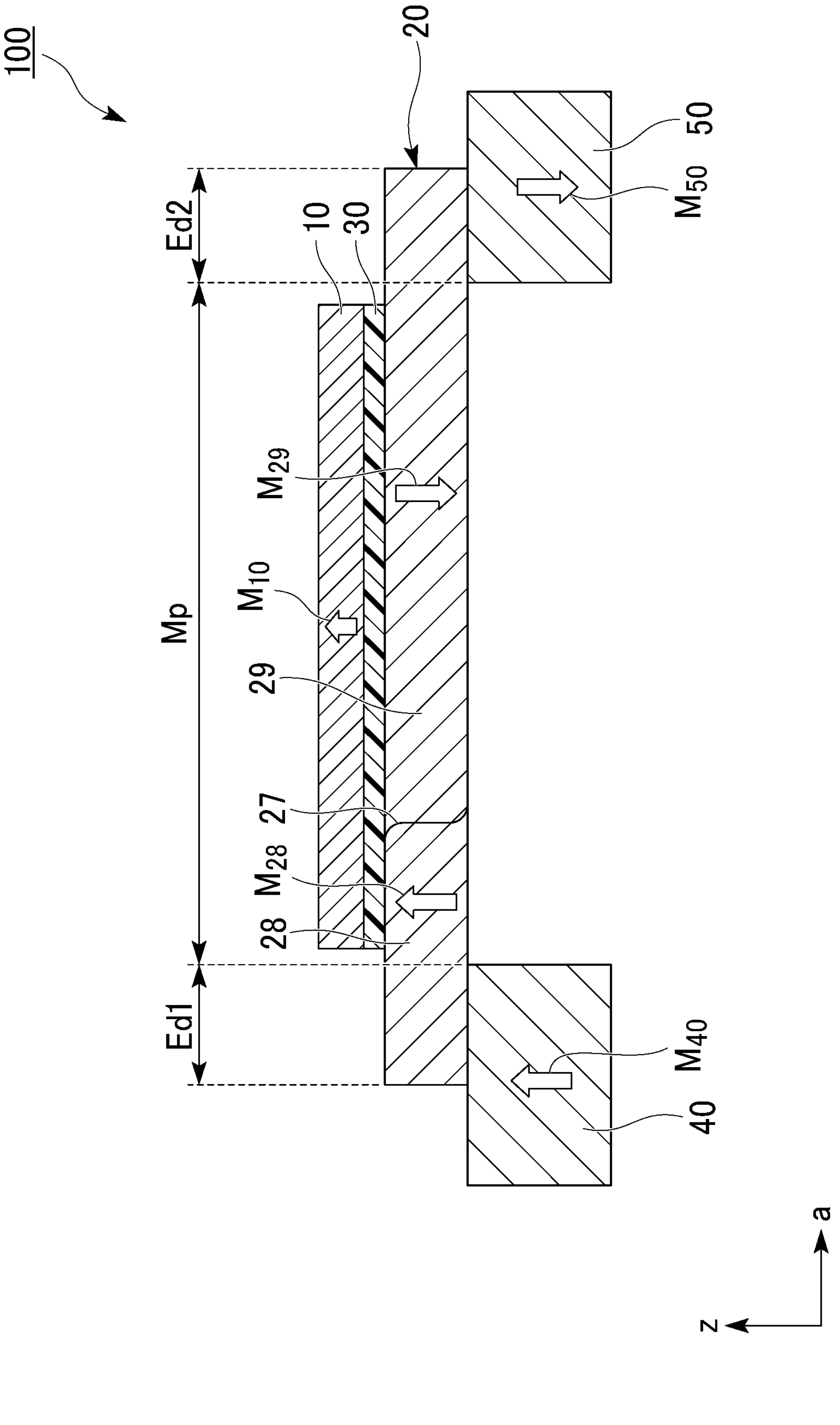
FIG. 4 is an enlarged cross-sectional view of the one domain wall motion element constituting the product-sum calculator according to the first embodiment.

FIG. 4 is an enlarged cross-sectional view of the one domain wall motion element 100 constituting the product-sum calculator 200 according to the first embodiment. The domain wall motion element 100 includes a first ferromagnetic layer 10, a domain wall motion layer 20, a non-magnetic layer 30, a first conductive portion 40, and a second conductive portion 50.

The first conductive portion 40 and the second conductive portion 50 are located on a side opposite to the non-magnetic layer 30 with respect to the domain wall motion layer 20. The first conductive portion 40 and the second conductive portion 50 are, for example, connection portions between the via wiring 90 and the domain wall motion layer 20. The first conductive portion 40 is connected to the second wiring w2 via the via wiring 90 and the second transistor Tr2. The second conductive portion 50 is connected to the third wiring w3 via the via wiring 90 and the third transistor Tr3. At least a part of the first conductive portion 40 faces a first end portion Ed1 of the domain wall motion layer 20. At least a part of the second conductive portion 50 faces a second end portion Ed2 of the domain wall motion layer 20.

Plan-view shapes of the first conductive portion 40 and the second conductive portion 50 from the z direction are not particularly limited. The plan-view shapes of the first conductive portion 40 and the second conductive portion 50 are, for example, rectangular, circular, or elliptical.

The first conductive portion 40 and the second conductive portion 50 include, for example, magnetic materials. The first conductive portion 40 have, for example, magnetization $M_{40}$. The second conductive portion 50 have, for example, magnetization $M_{50}$. An orientation of the magnetization $M_{40}$ of the first conductive portion 40 is different from an orientation of the magnetization $M_{50}$ of the second conductive portion 50. The magnetization $M_{40}$ of the first conductive portion 40 is oriented, for example, in the same direction as magnetization $M_{10}$ of the first ferromagnetic layer 10 and the magnetization $M_{50}$ of the second conductive portion 50 is oriented, for example, in a direction opposite to the magnetization $M_{10}$ of the first ferromagnetic layer 10.

The first conductive portion 40 and the second conductive portion 50 include, for example, a metal selected from the group consisting of Cr, Mn, Co, Fe and Ni, an alloy containing one or more of these metals, an alloy containing these metals and at least one or more elements of B, C, and N, or the like. The first conductive portion 40 and the second conductive portion 50 are, for example, Co—Fe, Co—Fe—B, Ni—Fe, or the like. Further, the first conductive portion 40 and the second conductive portion 50 may have a synthetic antiferromagnetic structure (SAF structure). The synthetic antiferromagnetic structure consists of two magnetic layers sandwiching a non-magnetic layer. Magnetizations of the two magnetic layers are pinned, and directions of the pinned magnetizations are opposite to each other.

The domain wall motion layer 20 is located in the z direction of the first conductive portion 40 and the second conductive portion 50. The domain wall motion layer 20 is formed to straddle between the first conductive portion 40 and the second conductive portion 50. The domain wall motion layer 20 may be directly connected to the first conductive portion 40 or the second conductive portion 50, or may be connected via a layer between them.

The domain wall motion layer 20 is a layer on which information can be recorded by changing a magnetic state therein. The domain wall motion layer 20 is a magnetic layer located closer to the first conductive portion 40 and the second conductive portion 50 than the non-magnetic layer 30. The domain wall motion layer 20 extends in the a direction. The domain wall motion layer 20 shown in FIG. 4 is, for example, rectangular in a plan view from the z direction.

The domain wall motion layer 20 has a first magnetic domain 28 and a second magnetic domain 29 therein. Magnetization $M_{28}$ of the first magnetic domain 28 and magnetization $M_{29}$ of the second magnetic domain 29 are oriented in opposite directions. A boundary between the first magnetic domain 28 and the second magnetic domain 29 is a domain wall 27. The domain wall motion layer 20 can have the domain wall 27 therein. In the domain wall motion element 100 shown in FIG. 4, the magnetization $M_{28}$ of the first magnetic domain 28 is oriented in a +z direction, and the magnetization $M_{29}$ of the second magnetic domain 29 is oriented in a −z direction. Hereinafter, an example in which magnetization is oriented in a z axis direction will be described, but magnetizations of the domain wall motion layer 20 and the first ferromagnetic layer 10 may be oriented in the x-axis direction or may be oriented in any direction in a xy plane.

The domain wall motion element 100 records data in multiple values or continuously in accordance with a position of the domain wall 27 of the domain wall motion layer 20. The data recorded on the domain wall motion layer 20 is read out as a change in resistance value of the domain wall motion element 100 when the read current is applied.

A ratio of the first magnetic domain 28 to the second magnetic domain 29 in the domain wall motion layer 20 changes as the domain wall 27 moves. The magnetization $M_{10}$ of the first ferromagnetic layer 10 is in the same direction as (parallel to) the magnetization $M_{28}$ of the first magnetic domain 28, and is in a direction opposite (antiparallel) to the magnetization $M_{29}$ of the second magnetic domain 29. When the domain wall 27 moves and an area at which the first ferromagnetic layer 10 and the first magnetic domain 28 overlap increases in a plan view from the z direction, a resistance value of the domain wall motion element 100 decreases. On the contrary, when an area at which the first ferromagnetic layer 10 and the second magnetic domain 29 overlap increases in a plan view from the z direction, the resistance value of the domain wall motion element 100 increases.

The domain wall 27 moves when the write current flows in the a direction of the domain wall motion layer 20 or an external magnetic field is applied thereto. For example, when the write current (for example, a current pulse) is applied in the a direction of the domain wall motion layer 20, the domain wall 27 moves.

The domain wall motion layer 20 can be divided into a plurality of different regions. Hereinafter, the plurality of regions will be referred to as a main portion Mp, the first end portion Ed1, and the second end portion Ed2 for convenience. The first end portion Ed1 is a portion facing the first conductive portion 40. The second end portion Ed2 is a portion facing the second conductive portion 50. The main portion Mp is a region sandwiched between the first end portion Ed1 and the second end portion Ed2.

A magnetization direction of the first end portion Ed1 is pinned by the magnetization $M_{40}$ of the first conductive portion 40. A magnetization direction of the second end portion Ed2 is pinned by the magnetization $M_{50}$ of the second conductive portion 50. An orientation direction of magnetization of the first end portion Ed1 and an orientation direction of magnetization of the second end portion Ed2 are different from each other. The magnetization of the first end portion Ed1 and the magnetization of the second end portion Ed2 are, for example, antiparallel to each other.

The domain wall motion layer 20 is made of a magnetic material. As the magnetic material constituting the domain wall motion layer 20, a metal selected from the group consisting of Cr, Mn, Co, Fe and Ni, an alloy containing one or more of these metals, and B, C, and N of these metals, an alloy containing these metals and at least one or more elements of B, C, and N, or the like can be used. The domain wall motion layer 20 is, for example, Co—Fe, Co—Fe—B, or Ni—Fe.

The domain wall motion layer 20 preferably has at least one element selected from the group consisting of Co, Ni, Pt, Pd, Gd, Tb, Mn, Ge, and Ga. As a material used for the domain wall motion layer 20, a laminated film of Co and Ni, a laminated film of Co and Pt, a laminated film of Co and Pd, an MnGa-based material, a GdCo-based material, or a TbCo-based material can be exemplified. Ferrimagnetic materials such as MnGa-based materials, GdCo-based materials, and TbCo-based materials have a small saturation magnetization, and a threshold electric current required to move the domain wall is small. Further, the laminated film of Co and Ni, the laminated film of Co and Pt, and the laminated film of Co and Pd have a large coercive force, and a moving speed of the domain wall decreases.

The non-magnetic layer 30 is located between the first ferromagnetic layer 10 and the domain wall motion layer 20. The non-magnetic layer 30 is laminated on one surface of the domain wall motion layer 20 in the z direction.

The non-magnetic layer 30 is made of, for example, a non-magnetic insulator, semiconductor or metal. The non-magnetic insulator is, for example, $Al_2O_3$, $SiO_2$, MgO, $MgAl_2O_4$, or a material in which some of these Al, Si, and Mg are replaced with Zn, Be, and the like. These materials have a large bandgap and are excellent in insulating properties. In a case in which the non-magnetic layer 30 is made of the non-magnetic insulator, the non-magnetic layer 30 is a tunnel barrier layer. The non-magnetic metal is, for example, Cu, Au, Ag, or the like. Further, the non-magnetic semiconductor is, for example, Si, Ge, $CuInSe_2$, $CuGaSe_2$, Cu (In, Ga) $Se_2$, or the like.

A thickness of the non-magnetic layer 30 is preferably 20 Å or more, and more preferably 30 Å or more. When the thickness of the non-magnetic layer 30 is large, a resistance area product (RA) of the domain wall motion element 100 increases. The resistance area product (RA) of the domain wall motion element 100 is preferably $1\times10^5$ Ωμm$^2$ or more, and more preferably $1\times10^6$ Ωμm$^2$ or more. The resistance area product (RA) of the domain wall motion element 100 is represented by a product of an element resistance of one domain wall motion element 100 and an element cross-sectional area of the domain wall motion element 100 (an area of a cut surface obtained by cutting the non-magnetic layer 30 in the xy plane).

The first ferromagnetic layer 10 is located in the +z direction of the non-magnetic layer 30. The first ferromagnetic layer 10 faces the non-magnetic layer 30. The first ferromagnetic layer 10 is connected to the first wiring w1 via the electrode 70 and the first transistor Tr1 (see FIG. 3). The electrode 70 is a conductor connecting the first ferromagnetic layer 10 to the via wiring 90.

The first ferromagnetic layer 10 has the magnetization $M_{10}$ oriented in one direction. The magnetization direction of the first ferromagnetic layer 10 is less likely to change than that of the domain wall motion layer 20 when a predetermined external force is applied thereto. The predetermined external force is, for example, an external force applied to the magnetization due to an external magnetic field or an external force applied to the magnetization due to a spin polarization electric current.

The first ferromagnetic layer 10 contains a ferromagnet. The first ferromagnetic layer 10 is, for example, a metal selected from the group consisting of Cr, Mn, Co, Fe and Ni, an alloy containing at least one of these metals, an alloy containing these metals and at least one or more elements of B, C, and N, or the like. The first ferromagnetic layer 10 is, for example, Co—Fe, Co—Fe—B, or Ni—Fe.

The first ferromagnetic layer 10 may be a Whistler alloy. The Heusler alloy is a half metal and has a high spin polarizability. The Heusler alloy is an intermetallic compound having a chemical composition of XYZ or $X_2YZ$, in which X is a transition metal element or a noble metal element of the Co, Fe, Ni, or Cu group on the periodic table, Y is a Mn, V, Cr, or Ti group transition metal or an elemental species of X, and Z is a typical element of groups III to V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, or $Co_2FeGe_{1-c}Ga_c$.

A film thickness of the first ferromagnetic layer 10 is preferably 1.5 nm or less, and more preferably 1.0 nm or less, in a case in which a magnetization easy axis of the first ferromagnetic layer 10 is in the z direction (in a case in which it is a perpendicular magnetization film). When the film thickness of the first ferromagnetic layer 10 is reduced, the magnetization of the first ferromagnetic layer 10 is likely to be oriented in the z direction. This is because vertical magnetic anisotropy (interfacial perpendicular magnetic anisotropy) is added to the first ferromagnetic layer 10 at an interface between the first ferromagnetic layer 10 and another layer (non-magnetic layer 30).

The magnetization of the first ferromagnetic layer 10 is pinned in the z direction as an example. For example, when a laminate is provided on a surface of the first ferromagnetic layer 10 opposite to the non-magnetic layer 30 via a spacer layer, the magnetization of the first ferromagnetic layer 10 can be easily oriented in the z direction. The laminate is, for example, a laminate of a ferromagnetic material selected from the group consisting of Co, Fe, and Ni and a non-magnetic material selected from the group consisting of Pt, Pd, Ru, and Rh. The spacer layer is, for example, a non-magnetic material selected from the group consisting of Ta, W, and Ru. When the ferromagnetic material and the non-magnetic material are laminated, the laminate exhibits vertical magnetic anisotropy. The laminate exhibiting vertical magnetic anisotropy is magnetically coupled to the first ferromagnetic layer 10 via the spacer layer, and thus the magnetization of the first ferromagnetic layer 10 is more strongly oriented in the z direction. Further, in the laminate, a non-magnetic material selected from the group consisting of Ir and Ru as an intermediate layer may be inserted at any position of the laminate. By providing the intermediate layer, the laminate can have a synthetic antiferromagnetic structure (SAF structure), and the magnetization of the first ferromagnetic layer 1 can be more stably oriented in the z direction.

An antiferromagnetic layer may be provided on a surface of the first ferromagnetic layer 10 opposite to the non-magnetic layer 30 via a spacer layer. When the first ferromagnetic layer 10 and the antiferromagnetic layer are magnetically coupled, a coercive force of the first ferromagnetic layer 10 increases. The antiferromagnetic layer is, for example, IrMn, PtMn, or the like. The spacer layer contains, for example, at least one selected from the group consisting of Ru, Ir, and Rh.

The domain wall motion element 100 is obtained by laminating each layer and processing each layer into a predetermined shape. For the lamination of each layer, a sputtering method, a chemical vapor deposition (CVD) method, an electron beam vapor deposition method (EB vapor deposition method), an atomic laser deposit method, or the like can be used. The processing of each layer can be performed by using photolithography or the like.

Figure 5:
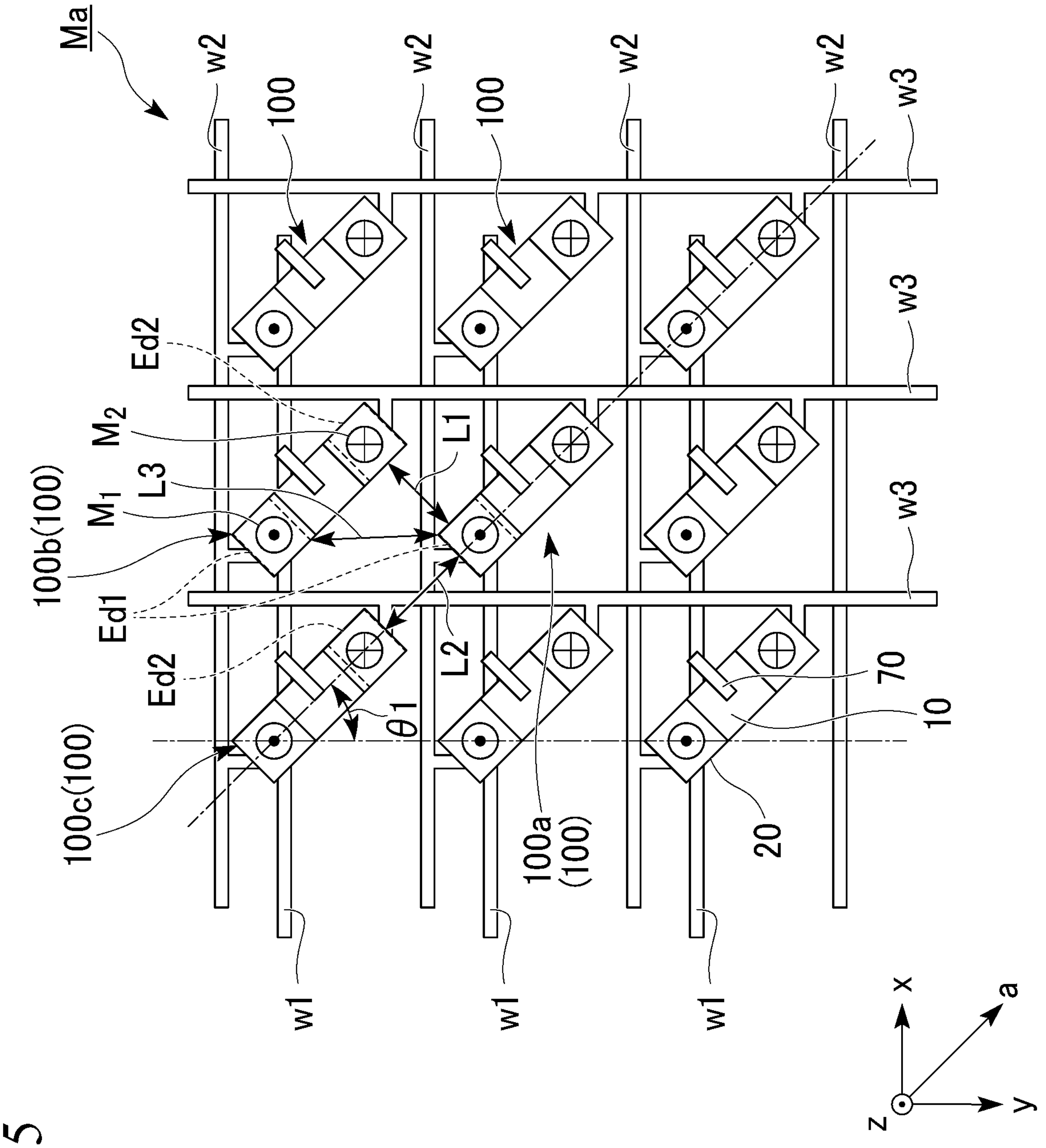
FIG. 5 is an enlarged schematic view of a part of a magnetic recording array constituting the product-sum calculator according to the first embodiment.

FIG. 5 is an enlarged schematic view of a part of the magnetic recording array Ma constituting the product-sum calculator 200 according to the first embodiment. The magnetic recording array Ma has the plurality of domain wall motion elements 100.

The domain wall motion layers 20 of the plurality of domain wall motion elements 100 each extend in the a direction. The a direction is different from the x direction and the y direction. The domain wall motion layer 20 extends in a direction inclined by an angle θ1 with respect to the y direction. In FIG. 5, the angle θ1 is 45 degrees.

The domain wall motion layers 20 of the plurality of domain wall motion elements 100 have the first end portion Ed1 and the second end portion Ed2, respectively. Magnetization $M_1$ of the first end portion Ed1 is oriented, for example, in the +z direction and magnetization $M_2$ of the second end portion Ed2 is oriented, for example, in the −z direction. Since the magnetizations $M_1$ are oriented in the same direction (directions of the magnetizations $M_1$ are parallel to each other), the first end portions Ed1 of the different domain wall motion elements 100 are in a relationship of magnetically repelling each other. Since the magnetizations $M_2$ are oriented in the same direction (directions of the magnetizations $M_1$ are parallel to each other), the second end portions Ed2 of different domain wall motion elements 100 are also in a relationship of magnetically repelling each other. On the other hand, in the first end portions Ed1 and the second end portions Ed2 of the different domain wall motion elements 100, the magnetizations $M_1$ and $M_2$ are oriented in opposite directions (the directions of the magnetizations $M_1$ and the magnetizations $M_2$ are antiparallel to each other), they are in a relationship of magnetically stabilizing each other.

Here, one domain wall motion element 100 of the plurality of domain wall motion elements 100 will be referred to as a first element 100*a*. There are a plurality of domain wall motion elements 100 around the first element 100*a*.

Distances between the first end portion Ed1 of the first element 100*a* and the second end portions Ed2 of the domain wall motion layers 20 of the domain wall motion elements 100 adjacent to the first element 100*a* will be referred to as a first distance L1 and a second distance L2 in order from the closest one. The first distance L1 is the shortest distance between the first end portion Ed1 of the first element 100*a* and the second end portion Ed2 closest to the first end portion Ed1 of the first element 100*a*. The second distance L2 is the shortest distance between the first end portion Ed1 of the first element 100*a* and the second end portion Ed2 that is second closest to the first end portion Ed1 of the first element 100*a*. The first distance L1 and the second distance L2 may coincide with each other. The magnetic wall motion element 100 having the second end portion Ed2 at the first distance L1 to the first end portion Ed1 of the first element 100*a* is referred to as the second element 100*b*. The magnetic wall motion element 100 having the second end portion Ed2 at the second distance L2 to the first end portion Ed1 of the first element 100*a* is referred to as the third element 100*c*.

Further, a distance between the first end portion Ed1 of the first element 100*a* and the first end portion Ed1 closest to the first end portion Ed1 of the first element 100*a* will be referred to as a third distance L3. In FIG. 5, the magnetic wall motion element 100 with the first end portion Ed1 at the third distance L3 to the first end portion Ed1 of the first element 100*a* is the second element 100*b*. The first distance L1 and the second distance L2 are shorter than the third distance L3. For example, the first distance L1, the second distance L2 and the third distance L3 are shorter than the element length in the a-direction of the domain wall motion layer 20 of the magnetic wall motion element 100. The element length in the a-direction of each of the magnetic wall motion elements 100 is, for example, longer than the first distance L1, the second distance L2, and the third distance L3.

Next, an operation of the product-sum calculator 200 according to the first embodiment will be described.

First, an operation of writing data to each domain wall motion element 100 of the magnetic recording array Ma will be described. In the case of writing data to a predetermined domain wall motion element 100, the second transistor Tr2 and the third transistor Tr3 connected to a selected domain wall motion element 100 are turned on (see FIGS. 2 and 3). When the second transistor Tr2 and the third transistor Tr3 are turned on, the write current flows from the second power supply Ps2 to the domain wall motion layer 20 via the second wiring w2. The write current moves the position of the domain wall 27 of the domain wall motion layer 20, and data is written to the domain wall motion element 100.

Next, an operation of reading data from each domain wall motion element 100 of the magnetic recording array Ma will be described. In the case of reading data from a predetermined domain wall motion element 100, the first transistor Tr1 and the third transistor Tr3 connected to a selected domain wall motion element 100 are turned on (see FIGS. 2 and 3). When the first transistor Tr1 and the third transistor Tr3 are turned on, the read current flows from the first power supply Ps1 to the domain wall motion element 100 via the first wiring w1. The read current flows from the first ferromagnetic layer 10 of the domain wall motion element 100 toward the second conductive portion 50, for example. The read current flows in the z direction of the domain wall motion element 100, and thus the resistance value of the domain wall motion element 100 is read out as data.

In the product-sum calculator 200, the first transistors Tr1 and the third transistors Tr3 connected to all the domain wall motion elements 100 belonging to the first element array ER1 are turned on. The data read from each domain wall motion element 100 is put together in the third wiring w3 and is summed with each other by the sum calculation unit Sum.

The product-sum calculator 200 according to the first embodiment can magnetically stably and densely integrate the domain wall motion elements 100. The reason will be described below.

As shown in FIG. 5, the first distance L1 and the second distance L2 are shorter than the third distance L3. The first distance L1 and the second distance L2 are distances between the first end portion Ed1 and the second end portions Ed2 in which the magnetizations $M_1$ and $M_2$ are oriented in opposite directions. The third distance L3 is a distance between the first end portions Ed1 in which the magnetizations $M_1$ are oriented in the same direction. When the first distance L1 and the second distance L2 are shorter than the third distance, the respective domain wall motion elements 100 of the magnetic recording array Ma are magnetically stabilized.

In addition, the respective domain wall motion elements 100 are regularly arranged in the x direction and the y direction. When the domain wall motion elements 100 are regularly arranged, the domain wall motion elements 100 can be integrated at a high density, and the integration of the magnetic recording array Ma is enhanced.

Further, the domain wall motion layer 20 of the domain wall motion element 100 extends in the a direction and has a difference (an aspect ratio) between its length in the a direction and its length in a direction orthogonal to the a direction. The magnetic wall motion device 100 has a large aspect ratio in order to achieve a wide resistance change range. By disposing the domain wall motion layer 20 having the aspect ratio diagonally with respect to the x direction and the y direction, the first wiring w1, the second wiring w2, and the third wiring w3 can be regularly disposed. When the first wiring w1, the second wiring w2, and the third wiring w3 become regular, unnecessary routing of the first wiring w1, the second wiring w2, and the third wiring w3 is inhibited. Also, the magnetic recording array Ma in which the first wiring w1, the second wiring w2 and the third wiring w3 are regular is easy to manufacture.

Figure 6:
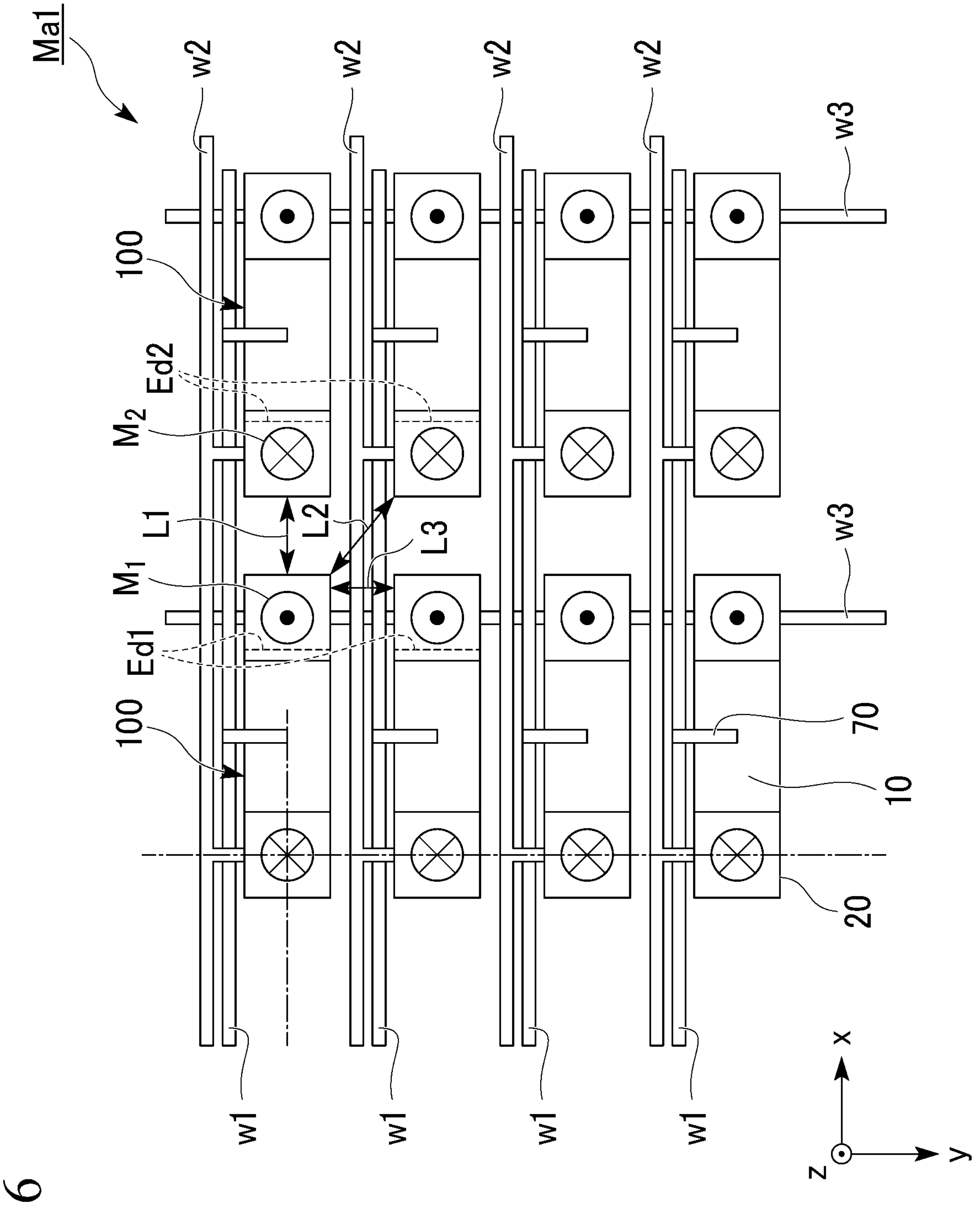
FIG. 6 is an enlarged schematic view of a part of a magnetic recording array according to a first comparative example.

FIG. 6 is an enlarged schematic view of a part of a magnetic recording array Ma1 according to a first comparative example. The magnetic recording array Ma1 has a plurality of domain wall motion elements 100, a plurality of first wirings w1, a plurality of second wirings w2, and a plurality of third wirings w3. The plurality of domain wall motion elements 100 of the magnetic recording array Ma1 are different from those of the magnetic recording array Ma according to the first embodiment in that the domain wall motion layers 20 extend in the x direction. In FIG. 6, the same configurations as those in FIG. 5 will be denoted by the same reference numerals, and the description thereof will be omitted.

The domain wall motion elements 100 are regularly arranged in the x direction and the y direction. The domain wall motion layers 20 of the plurality of domain wall motion elements 100 extend in the x direction. The domain wall motion layers 20 extend in a direction orthogonal to the y direction in which the first element array ER1 is arranged. The magnetic recording array Ma1 is excellent in the integration of the domain wall motion elements 100.

On the other hand, the third distance L3 is at least shorter than the second distance L2. The third distance L3 is the distance between the first end portions Ed1 in which the magnetizations $M_1$ are oriented in the same direction. When the third distance L3 is shorter than the second distance L2, the adjacent first end portions Ed1 magnetically repel each other. Accordingly, each domain wall motion element 100 of the magnetic recording array Ma1 is magnetically more unstable than that of the magnetic recording array Ma according to the first embodiment.

Figure 7:
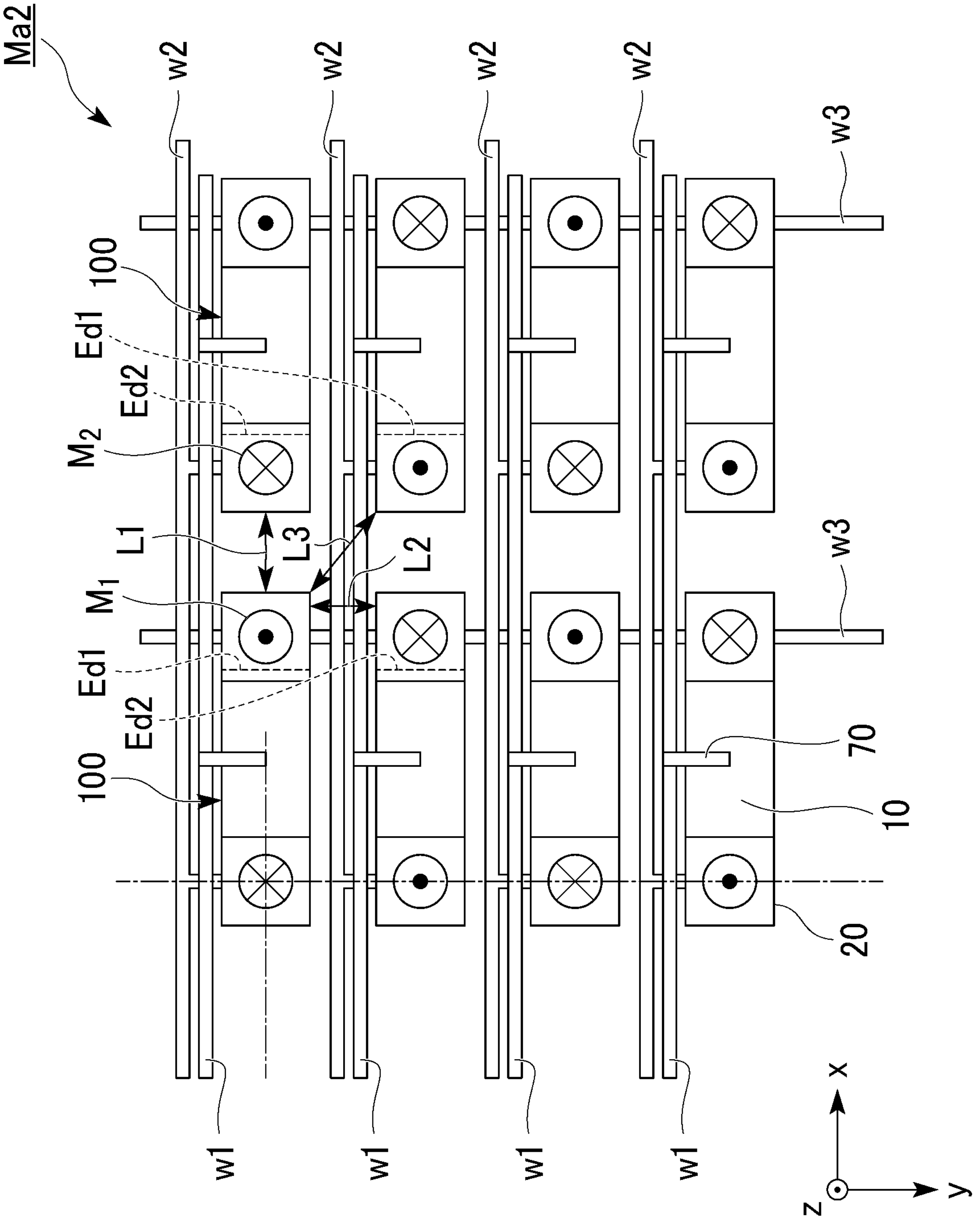
FIG. 7 is an enlarged schematic view of a part of a magnetic recording array according to a second comparative example.

FIG. 7 is an enlarged schematic view of a part of a magnetic recording array Ma2 according to a second comparative example. The magnetic recording array Ma2 has a plurality of domain wall motion elements 100, a plurality of first wirings w1, a plurality of second wirings w2, and a plurality of third wirings w3. The plurality of domain wall motion elements 100 of the magnetic recording array Ma2 are different from those of the magnetic recording array Ma according to the first embodiment in that the wall motion layers 20 extend in the x direction. Further, positional relationships between the first end portion Ed1 and the second end portions Ed2 in the respective domain wall motion elements 100 are different from those of the magnetic recording array Ma2 according to the first comparative example shown in FIG. 6. In FIG. 7, the same configurations as those in FIG. 5 will be denoted by the same reference numerals, and the description thereof will be omitted.

The domain wall motion elements 100 are regularly arranged in the x direction and the y direction. The domain wall motion layers 20 of the plurality of domain wall motion elements 100 extend in the x direction. The domain wall motion layers 20 extend in a direction orthogonal to the y direction in which the first element array ER1 is arranged. The magnetic recording array Ma2 is excellent in the integration of the domain wall motion elements 100.

The first distance L1 and the second distance L2 are shorter than the third distance L3. Accordingly, the magnetic recording array Ma2 is also magnetically stable. On the other hand, when an electric current is applied to each domain wall motion element 100 in the same direction (for example, in the +x direction), the resistance values of the respective domain wall motion elements 100 show different behaviors. In the case of applying an electric current in a predetermined direction, the resistance values of the domain wall motion elements 100 whose first end portions Ed1 are located in the +x direction from the second end portions Ed2 decrease, whereas the resistance values of the domain wall motion elements 100 whose first end portions Ed1 are located in the −x direction from the second end portion Ed2 increase. That is, in the magnetic recording array Ma2, in a case in which a write current is applied to the second wirings w2, elements whose resistance values increase and elements whose resistance values decrease are mixed. Accordingly, the magnetic recording array Ma2 shown in FIG. 7 is inferior in controllability to the magnetic recording array Ma according to the first embodiment.

An example of the product-sum calculator 200 according to the first embodiment has been described in detail above, but additions, omissions, replacements, and other changes of configurations can be made within the range without deviating from the gist of the present invention.

First Modified Example

Figure 8:
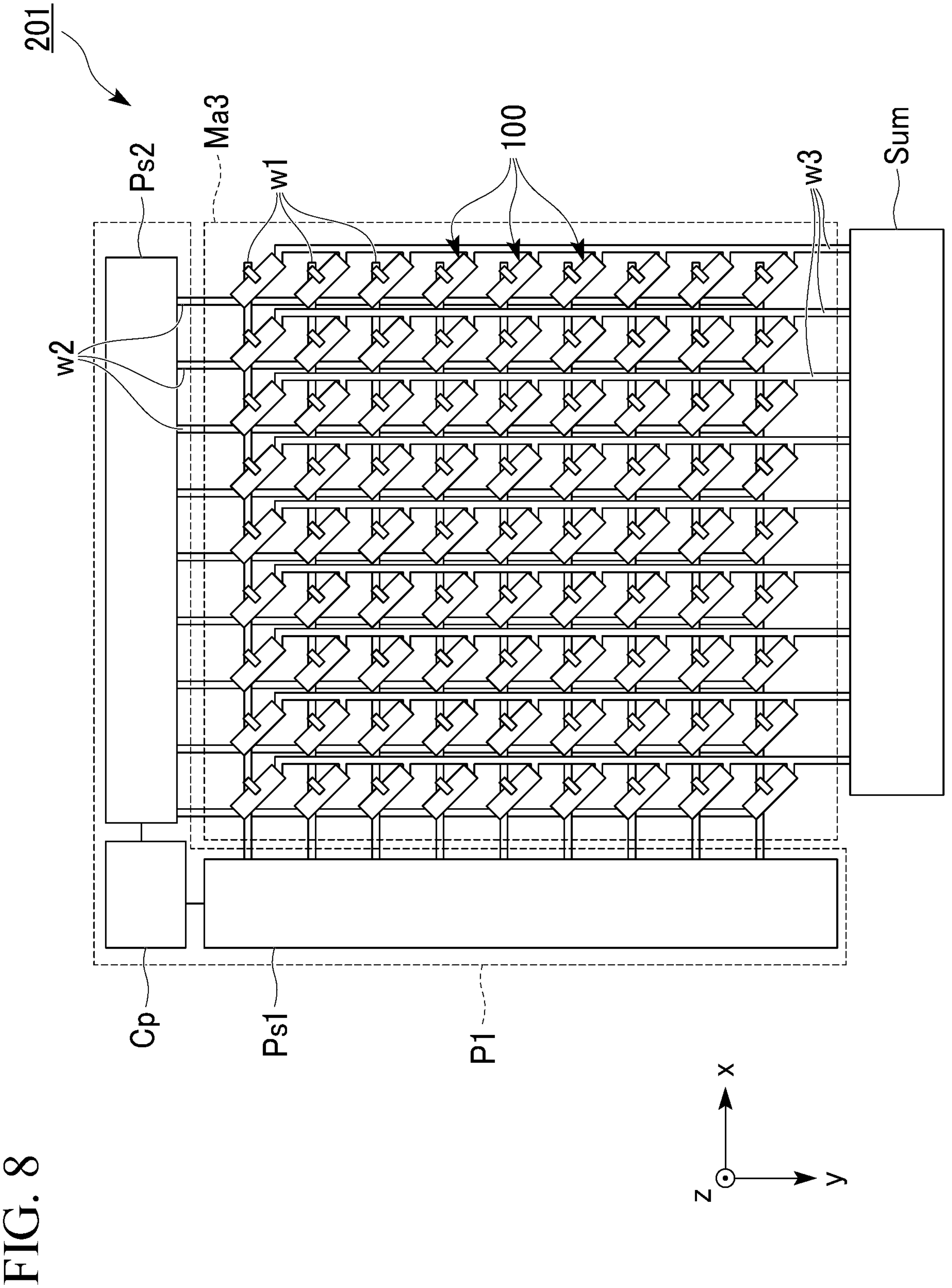
FIG. 8 is a schematic view of a product-sum calculator according to a first modified example.
Figure 9:
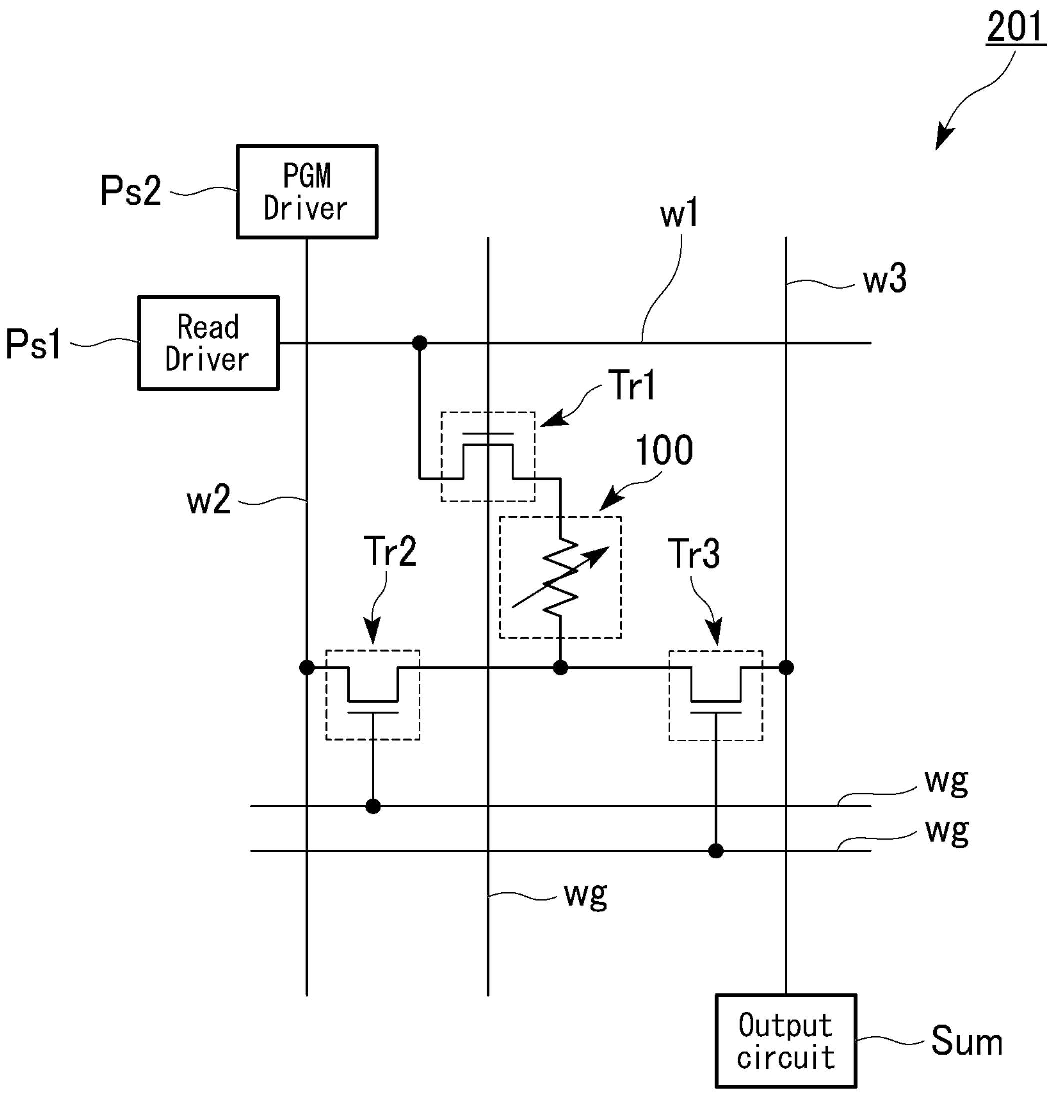
FIG. 9 is an enlarged circuit diagram of a periphery of one domain wall motion element constituting the product-sum calculator according to the first modified example.

FIG. 8 is a schematic view of a product-sum calculator 201 according to a first modified example. FIG. 9 is an enlarged circuit diagram of a periphery of one domain wall motion element constituting the product-sum calculator 201 according to the first modified example. The product-sum calculator 201 is different from the product-sum calculator 200 shown in FIG. 1 in the arrangement of the peripheral circuit P1 and the directions in which the second wirings w2 in the magnetic recording array Ma3 extend. In FIG. 8, the same configurations as those in FIG. 1 will be denoted by the same reference numerals, and in FIG. 9, the same configurations as those in FIG. 2 will be denoted by the same reference numerals, and the description thereof will be omitted.

A plurality of first wirings w1 and a plurality of second wirings w2 intersect each other. For example, the plurality of first wirings w1 and the plurality of second wirings w2 are orthogonal to each other. Further, for example, the plurality of second wirings w2 and a plurality of third wirings w3 are parallel to each other. In a case in which the first wirings w1 and the second wirings w2 are orthogonal to each other, the first power supply Ps1 and the second power supply Ps2 are located around different sides of the magnetic recording array Ma3.

The second power supply Ps2 is a power supply for applying a write current to the magnetic recording array Ma3 and applies a voltage larger than that of the first power supply Ps1 to the magnetic recording array Ma3. When the first power supply Ps1 and the second power supply Ps2 are adjacent to each other, the first power supply Ps1 is influenced by the second power supply Ps2. The read current applied from the first power supply Ps1 to the magnetic recording array Ma3 may become unstable due to the influence of the second power supply Ps2. Since the first power supply Ps1 and the second power supply Ps2 are located at different positions with respect to the magnetic recording array Ma3, the stability of the read current is improved.

Further, the product-sum calculator 201 according to the first modified example is also magnetically stable and excellent in controllability, like the product-sum calculator 200 according to the first embodiment.

Second Modified Example

Figure 10:
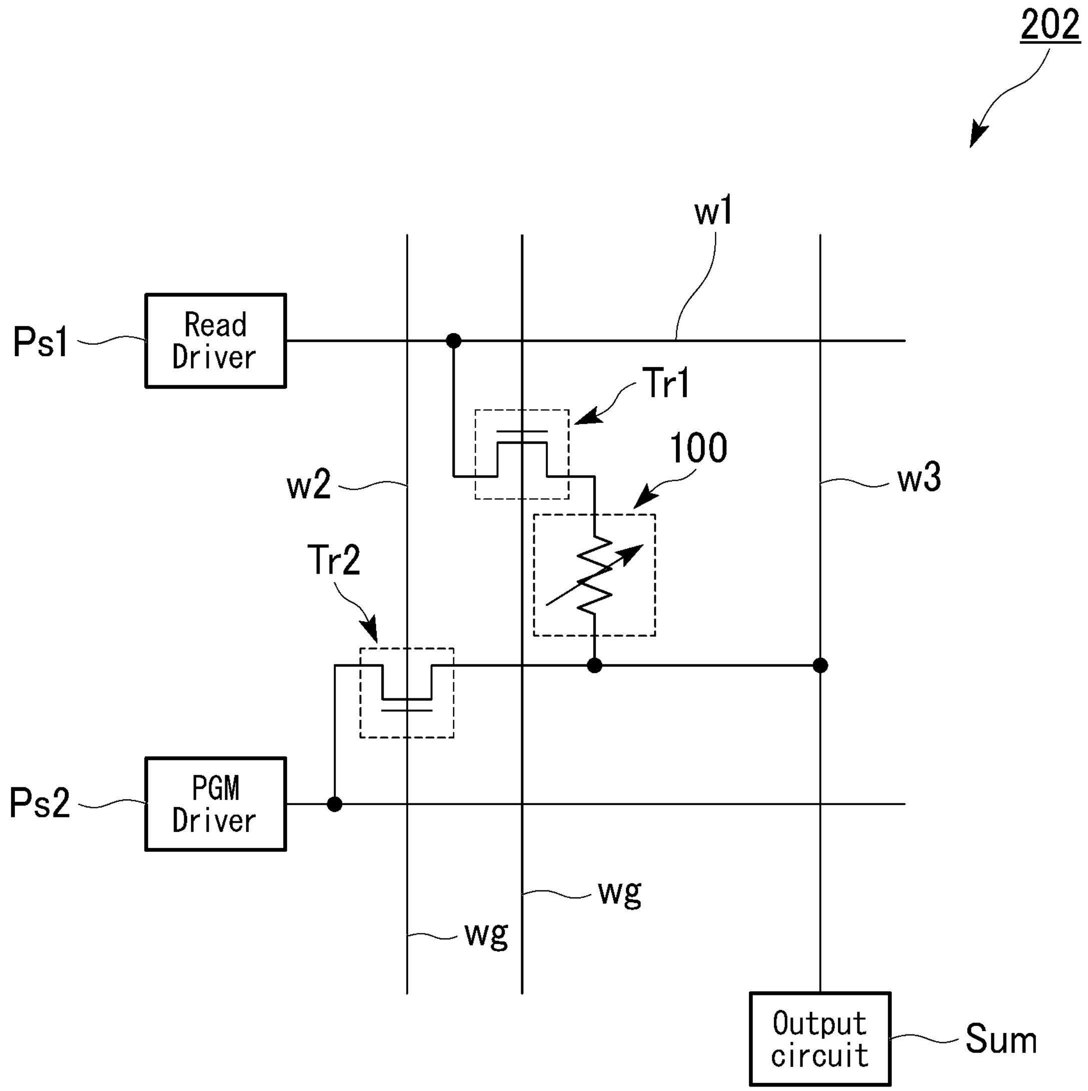
FIG. 10 is an enlarged circuit diagram of a periphery of one domain wall motion element constituting a product-sum calculator according to a second modified example.

FIG. 10 is an enlarged circuit diagram of a periphery of one domain wall motion element 100 constituting a product-sum calculator 202 according to a second modified example. The product-sum calculator 202 is different from the product-sum calculator 200 shown in FIG. 2 in that it does not have the third transistor Tr3. In FIG. 10, the same configurations as those in FIG. 2 will be denoted by the same reference numerals, and the description thereof will be omitted.

The product-sum calculator 202 is a two-terminal type element in which two transistors (first transistor Tr1 and second transistor Tr2) are provided for one domain wall motion element 100. The first transistor Tr1 controls application of a read current to the domain wall motion element 100, and the second transistor Tr2 controls application of a write current to the domain wall motion element 100. Only the first transistor Tr1 and the second transistor Tr2 can control writing of data to the domain wall motion element 100 and reading of data from the domain wall motion element 100. As shown in FIG. 3, an area occupied by the transistors in the xy plane is larger than an area occupied by the domain wall motion element 100 in the xy plane. By reducing the number of transistors, integration of the product-sum calculator 202 is further improved.

Further, the product-sum calculator 202 according to the second modified example is also magnetically stable and excellent in controllability, like the product-sum calculator 200 according to the first embodiment.

Third Modified Example

Figure 11:
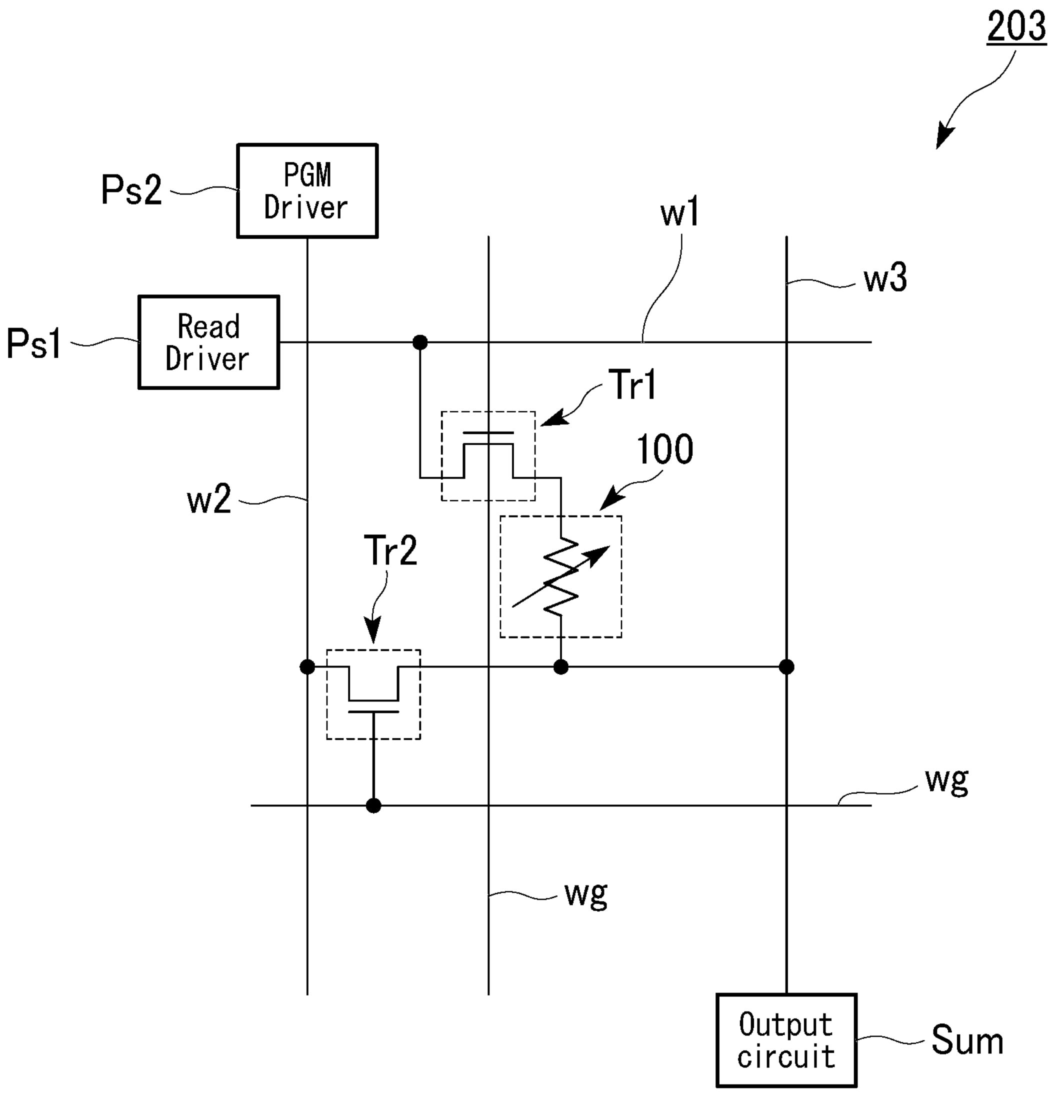
FIG. 11 is an enlarged circuit diagram of a periphery of one domain wall motion element constituting a product-sum calculator according to a third modified example.

FIG. 11 is an enlarged circuit diagram of a periphery of one domain wall motion element 100 constituting a product-sum calculator 203 according to a third modified example. The product-sum calculator 203 is different from the product-sum calculator 201 shown in FIG. 9 in that it does not have the third transistor Tr3. In FIG. 11, the same configurations as those in FIG. 9 will be designated by the same reference numerals, and the description thereof will be omitted.

The product-sum calculator 203 is a two-terminal type element in which two transistors (first transistor Tr1 and second transistor Tr2) are provided for one domain wall motion element 100. Similar to the second modified example, integration of the product-sum calculator 203 is further improved by reducing the number of transistors.

Further, the product-sum calculator 203 according to the third modified example is also magnetically stable and excellent in controllability, like the product-sum calculator 200 according to the first embodiment.

Fourth Modified Example

Figure 12:
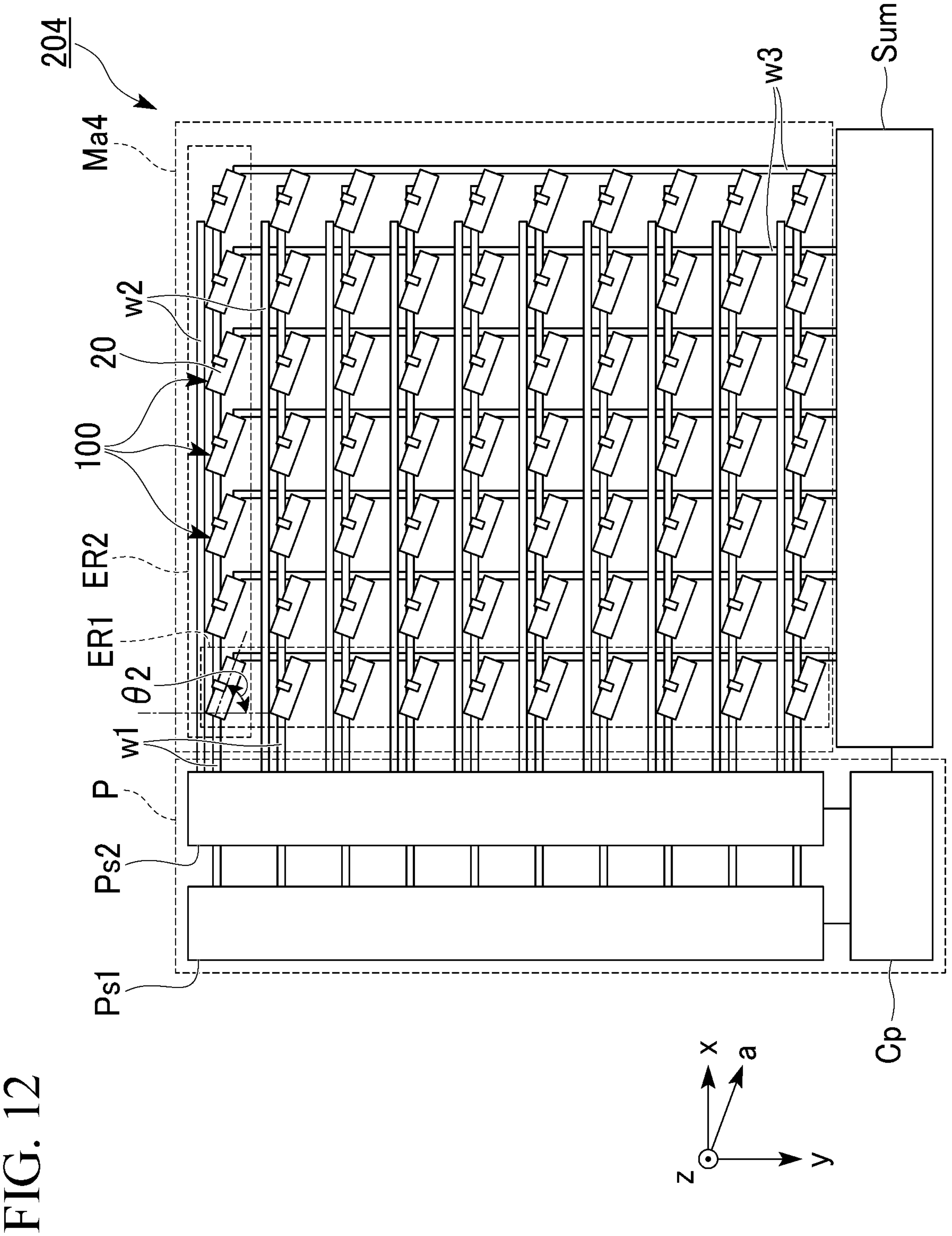
FIG. 12 is a schematic view of a product-sum calculator according to a fourth modified example.

FIG. 12 is a schematic view of a product-sum calculator 204 according to a fourth modified example. In the product-sum calculator 204, inclinations of the domain wall motion layers 20 of the domain wall motion elements 100 in a magnetic recording array Ma4 with respect to the y direction are different from those of the product-sum calculator 200 shown in FIG. 1. In FIG. 12, the same configurations as those in FIG. 1 will be denoted by the same reference numerals, and the description thereof will be omitted.

The product-sum calculator 204 has the magnetic recording array Ma4, the peripheral circuit P, and the sum calculation unit Sum. The magnetic recording array Ma4 has a plurality of domain wall motion elements 100. The domain wall motion layers 20 of the plurality of domain wall motion elements 100 extend in the a direction. The domain wall motion layers 20 extend in a direction inclined by an angle θ2 with respect to the y direction. The angle θ2 is, for example, greater than 45 degrees and less than 90 degrees.

A width occupied by each domain wall motion element 100 in the x direction is larger than a width occupied in the y direction. For that reason, the domain wall motion elements 100 are likely to be arranged at a higher density in the y direction than in the x direction. For example, the number of domain wall motion elements 100 constituting the first element array ER1 can be easily increased to be larger than the number of domain wall motion elements 100 constituting the second element array ER2.

The product-sum calculator 204 inputs a signal from the second power supply Ps2, performs a product calculation on the magnetic recording array Ma4, performs a sum calculation on the sum calculation unit Sum, and outputs the result. As the number of domain wall motion elements 100 constituting the first element train ER1 increases, the number of signals that can be input at one time increases. The product-sum calculator 204, which has a smaller number of domain wall motion elements 100 constituting the second element array ER2 than the first element array ER1, can be suitably applied when it is desired to reduce the number of output signals with respect to the number of input signals.

Further, the product-sum calculator 204 according to the fourth modified example is also magnetically stable and excellent in controllability, like the product-sum calculator 200 according to the first embodiment.

Fifth Modified Example

Figure 13:
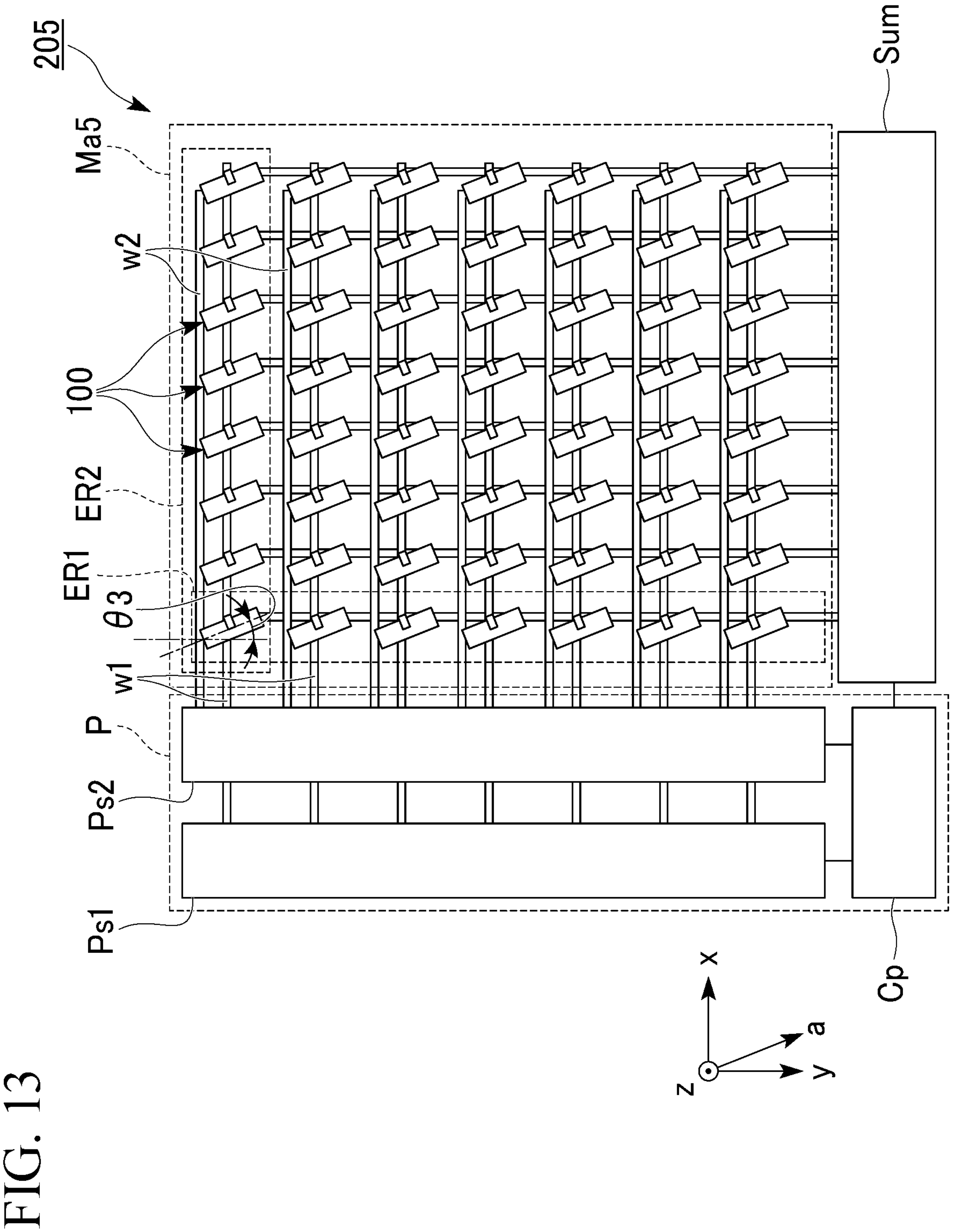
FIG. 13 is a schematic view of a product-sum calculator according to a fifth modified example.

FIG. 13 is a schematic view of a product-sum calculator 205 according to a fifth modified example. In the product-sum calculator 205, inclinations of the domain wall motion layers 20 of the domain wall motion elements 100 in a magnetic recording array Ma5 with respect to the y direction are different from those of the product-sum calculator 200 shown in FIG. 1. In FIG. 13, the same configurations as those in FIG. 1 will be denoted by the same reference numerals, and the description thereof will be omitted.

The product-sum calculator 205 has the magnetic recording array Ma5, the peripheral circuit P, and the sum calculation unit Sum. The magnetic recording array Ma5 has a plurality of domain wall motion elements 100. The domain wall motion layers 20 of the plurality of domain wall motion elements 100 extend in the a direction. The domain wall motion layers 20 extend in a direction inclined by an angle θ3 with respect to the y direction. The angle θ3 is, for example, greater than 0 degrees and less than 45 degrees.

A width occupied by each domain wall motion element 100 in the x direction is smaller than a width occupied in the y direction. For that reason, the domain wall motion elements 100 are likely to be arranged at a higher density in the x direction than in the y direction. For example, the number of domain wall motion elements 100 constituting the second element array ER2 is likely to be larger than the number of domain wall motion elements 100 constituting the first element array ER1.

The product-sum calculator 205 inputs a signal from the second power supply Ps2, performs a product calculation with the magnetic recording array Ma5, performs a sum calculation with the sum calculation unit Sum, and outputs the result. As the number of domain wall motion elements 100 constituting the second element array ER2 increases, the number of signals that can be output at one time increases. The product-sum calculator 205, which has a larger number of domain wall motion elements 100 constituting the second element array ER2 than the first element array ER1, can be suitably applied when it is desired to increase the number of output signals with respect to the number of input signals.

Further, the product-sum calculator 205 according to the fifth modified example is also magnetically stable and excellent in controllability, like the product-sum calculator 200 according to the first embodiment. In the product-sum calculator 200 according to the first embodiment, in a case in which the angle θ1 formed by the domain wall motion layer 20 with respect to the y direction is 45 degrees, and it can be suitably applied when it is desired to match the number of input signals with the number of output signals.

Sixth Modified Example

Figure 14:
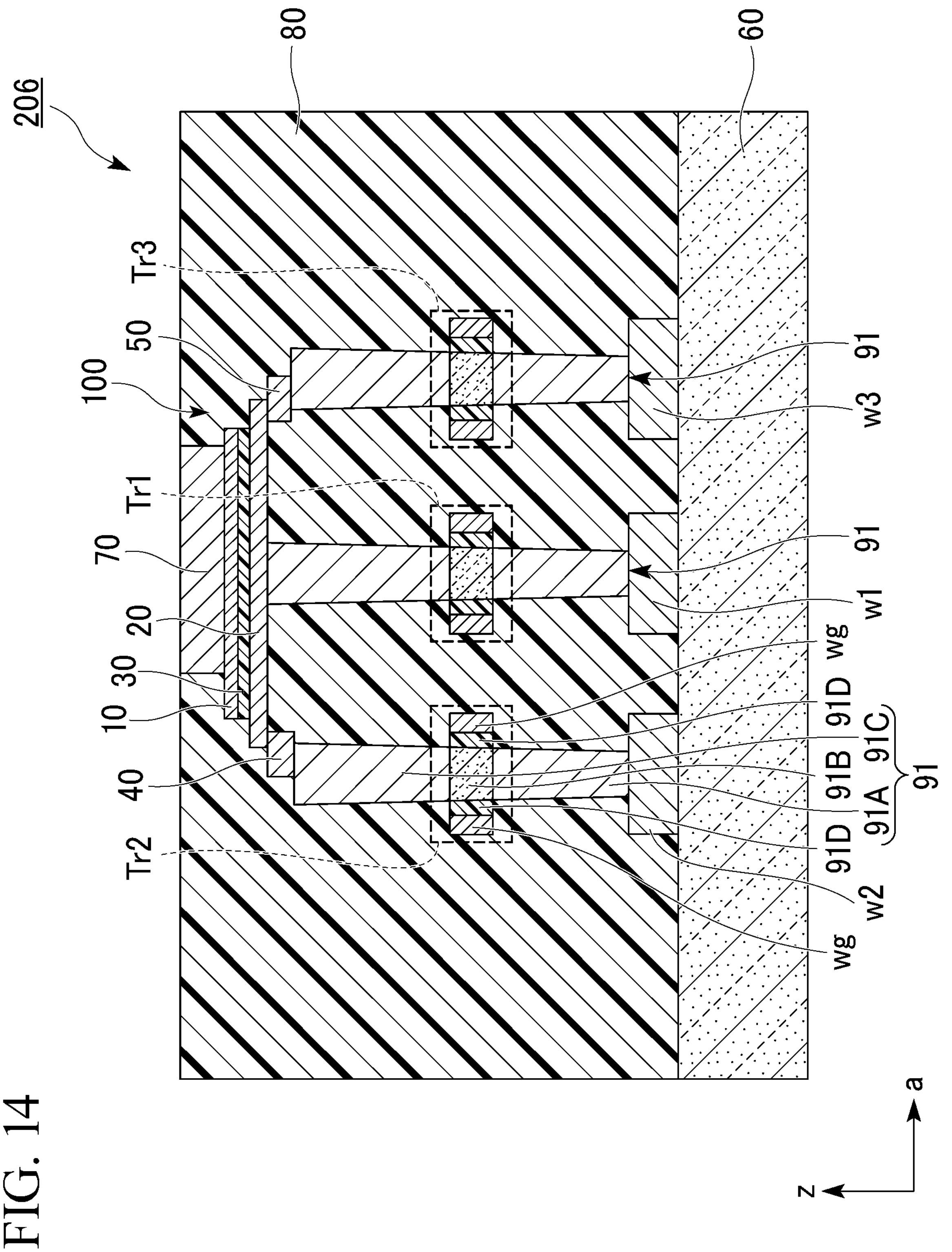
FIG. 14 is an enlarged cross-sectional view of a periphery of one domain wall motion element constituting a product-sum calculator according to a sixth modified example.

FIG. 14 is an enlarged cross-sectional view of a periphery of one domain wall motion element 100 constituting a product-sum calculator 206 according to a sixth modified example. The product-sum calculator 206 is different from the product-sum calculator 200 shown in FIG. 3 in the configuration of the transistor that operates the domain wall motion element 100. In FIG. 14, the same configurations as those in FIG. 3 will be denoted by the same reference numerals, and the description thereof will be omitted.

The product-sum calculator 206 includes the substrate 60, the interlayer insulating film 80, the first wiring w1, the second wiring w2, the third wiring w3, the gate wiring wg, a via wiring 91, and the domain wall motion element 100.

The via wiring 91 connects each of the first wiring w1, the second wiring w2, and the third wiring w3 to the domain wall motion element 100. The via wiring 91 that connects to the first wiring w1 is connected to the electrode 70 on the depth side of the paper. The via wiring 91 extends in the z direction. The via wiring 91 includes a vertical type transistor. The via wiring 91 includes a first columnar portion 91A, a second columnar portion 91B, and a third columnar portion 91C in order from a side closer to the substrate 60. The first columnar portion 91A and the third columnar portion 91C include conductors. The second columnar portion 91B is a semiconductor. The second columnar portion 91B serves as a channel for the transistor. Further, a gate insulating film 91D and the gate wiring wg are located on a side of the second columnar portion 91B. The gate insulating film 91D is located between the gate wiring wg and the second columnar portion 91B. Also, in the present specification, the vertical type transistor is a transistor having a structure in which a source and a drain are provided in the z direction and a semiconductor layer serving as the channel is provided between the source and the drain. For example, the first columnar portion 91A in FIG. 14 is one of the source and drain, and the third columnar portion 91C is the other of the source and drain. The second columnar portion 91B is, for example, silicon. The gate insulating film 91D is, for example, silicon oxide.

By forming the first transistor Tr1, the second transistor Tr2, and the third transistor Tr3 in the z direction, an area occupied by the transistors in the xy plane can be reduced, and integration of the product-sum calculator 206 can be further improved.

Also, although the modified example of the product-sum calculator according to the first embodiment has been described so far by taking the first modified example to the sixth modified example as examples, various other modifications are possible.

Figure 15:
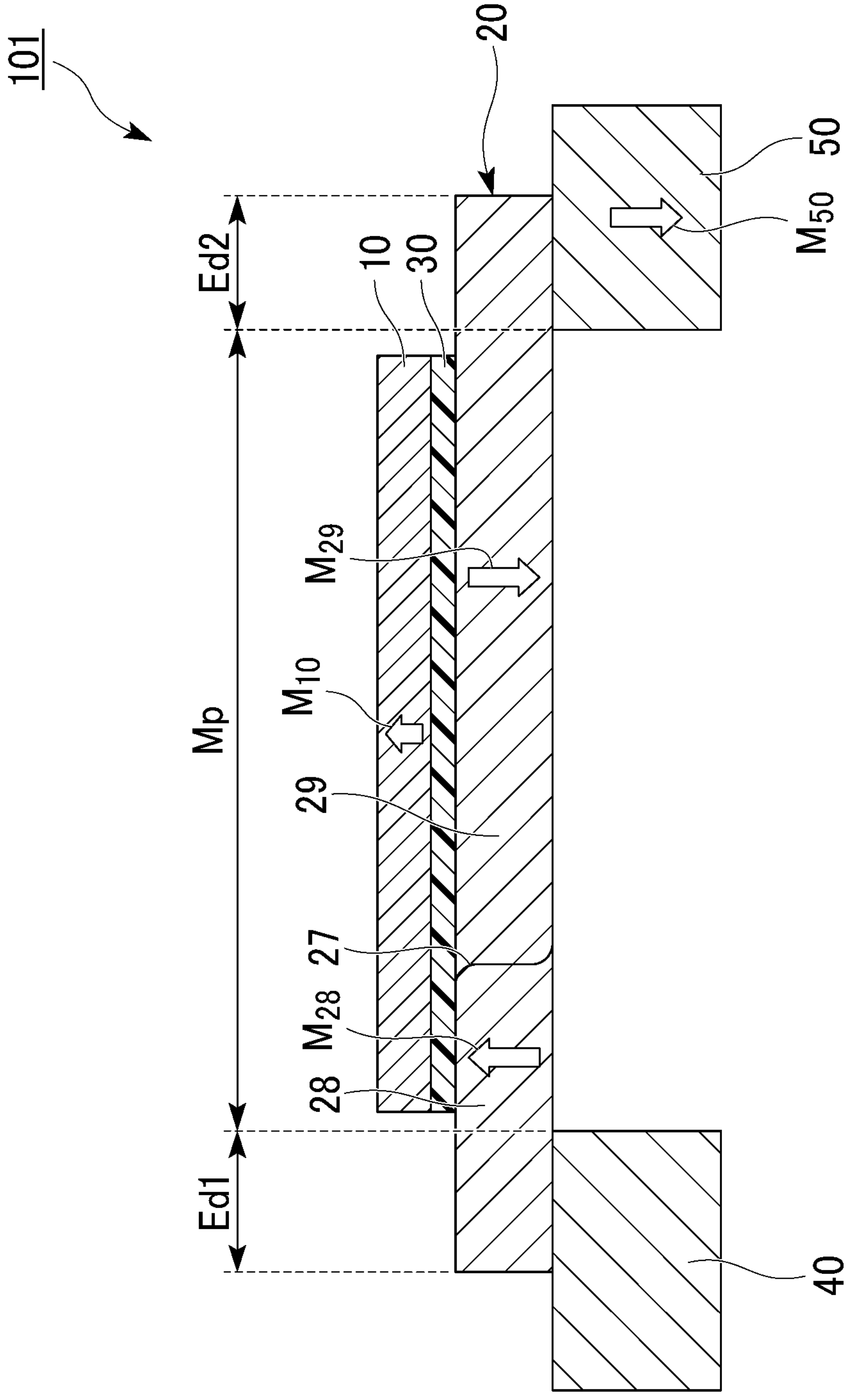
FIG. 15 is a schematic cross-sectional view of another example of a domain wall motion element constituting a product-sum calculator.

For example, FIG. 15 is a schematic cross-sectional view of another example of the domain wall motion element constituting the product-sum calculator. A domain wall motion element 101 shown in FIG. 15 is different from the domain wall motion element 100 shown in FIG. 4 in that the first conductive portion 40 does not have the magnetization $M_{40}$.

The first conductive portion 40 is a conductor. The first conductive portion 40 is, for example, Al, Cu, Ag or the like having excellent conductivity. The first conductive portion 40 overlaps the first end portion Ed1 of the domain wall motion layer 20 in the z direction. Although the magnetization of the first end Ed1 is not pinned, a current density of an electric current flowing in the domain wall motion layer 20 changes significantly from the main portion Mp to the first end portion Ed1. For that reason, the domain wall 27 is less likely to invade the first end portion Ed1 from the main portion Mp, and a moving range of the domain wall 27 is limited.

The domain wall motion element 101 shown in FIG. 15 may be replaced with the domain wall motion element 100 in the first embodiment and the first to sixth modified examples. Further, the second conductive portion 50 does not have to have the magnetization $M_{50}$.

Figure 17:
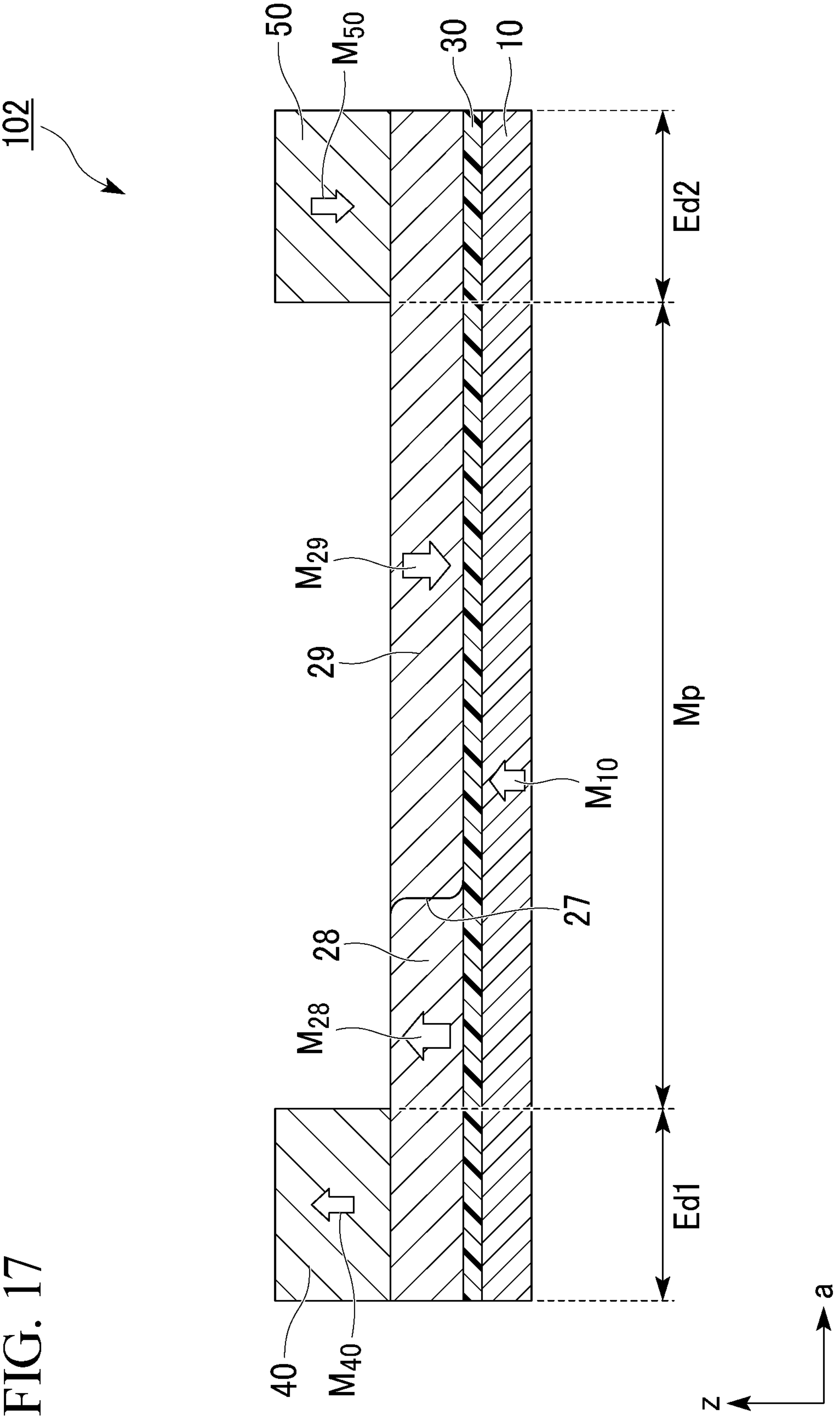
FIG. 17 is a schematic cross-sectional view of another example of a domain wall motion element constituting a product-sum calculator.

For example, FIG. 17 is a schematic cross-sectional view of another example of the domain wall motion element constituting the product-sum calculator. The magnetic wall motion element 102 shown in FIG. 17 is a bottom pin structure where the first ferromagnetic layer 10 is on the substrate 60 side than the magnetic wall transfer layer 20.

The magnetic wall motion element 102 shown in FIG. 17 may be replaced with the magnetic wall motion element 100 in the first embodiment and the first through sixth modified examples.

Further, in the magnetic recording array, the number of the domain wall motion elements 100 constituting the first element array ER1 and the second element row ER2 is arbitrary. Also, the peripheral circuit P may have elements other than the first power supply Ps1, the second power supply Ps2, and the control unit Cp.

In addition, inclination angles of the domain wall motion layers 20 of the plurality of domain wall motion elements 100 constituting the magnetic recording array with respect to the y direction do not have to be the same for all the domain wall motion elements 100 and may be different from each other.

Second Embodiment

Figure 16:
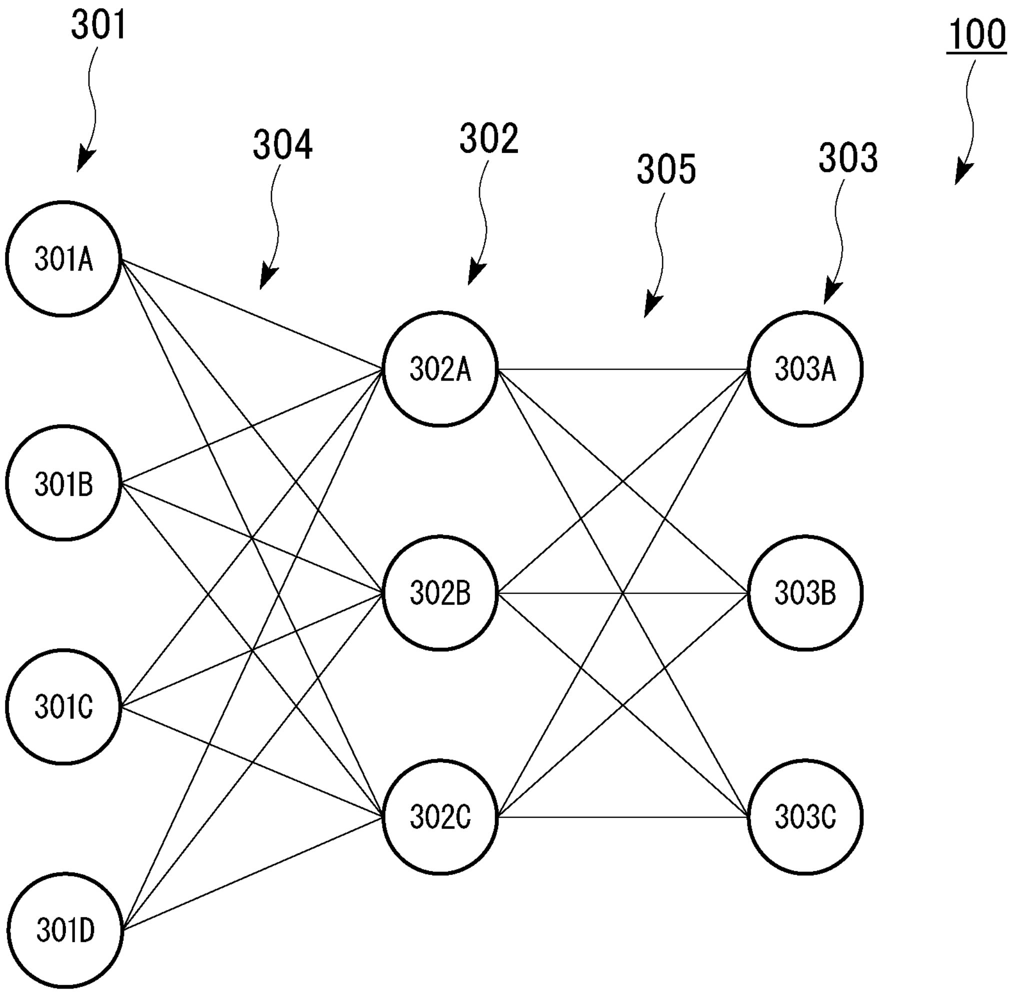
FIG. 16 is a schematic diagram of a neural network according to a second embodiment.

FIG. 16 is a schematic diagram of a neural network 300 that can be executed in a neuromorphic device according to a second embodiment. The neural network 300 includes an input layer 301, a hidden layer 302, an output layer 303, a product-sum calculator 304 that performs calculations on the hidden layer 302, and a product-sum calculator 305 that performs calculations on the output layer 303. As the product-sum calculators 304 and 305, the product-sum calculator 200 according to the first embodiment is used. For example, a device capable of performing a series of calculations of the input layer 301, the product-sum calculator 304, and the hidden layer 302, or a series of calculations of the hidden layer 302, the product-sum calculator 305, and the output layer 303 is the neuromorphic device. In the product-sum calculator 304, nodes (the number of outputs) of the hidden layer 302 is reduced with respect to nodes (the number of inputs) of the input layer 301, and the product-sum calculator 204 according to the fourth modified example is preferably used therefor, for example.

The input layer 301 includes, for example, four nodes 301A, 301B, 301C, and 301D. The hidden layer 302 includes, for example, three nodes 302A, 302B, and 302C. The output layer 303 includes, for example, three nodes 303A, 303B, and 303C.

The product-sum calculator 304 is disposed between the input layer 301 and the hidden layer 302. The product-sum calculator 304 connects each of the four nodes 301A, 301B, 301C, and 301D of the input layer 301 to each of the three nodes 302A, 302B, and 302C of the hidden layer 302. The product-sum calculator 304 changes weights by changing the resistance value of the domain wall motion element 100.

The product-sum calculator 305 is disposed between the hidden layer 302 and the output layer 303. The product-sum calculator 305 connects the three nodes 302A, 302B, and 302C of the hidden layer 302 to the three nodes 303A, 303B, and 303C of the output layer 303. The product-sum calculator 305 changes weights by changing the resistance value of the domain wall motion element 100. The hidden layer 302 uses, for example, an activation function (for example, a sigmoid function).

The neural network 300 gives weights to the data input from the input layer 301 in accordance with importance and outputs necessary data from the output layer 303. The weighting is performed by using the product-sum calculators 304 and 305 when each layer between the input layer 301, the hidden layer 302, and the output layer 303 is moved. The nodes of the input layer 301, the hidden layer 302, and the output layer 303 correspond to neurons of the brain, and the product-sum calculator 304 corresponds to the synapse of the brain. The neural network 300 can perform processing that imitates the brain and can perform complicated operations such as machine learning.

REFERENCE SIGNS LIST

10 First ferromagnetic layer
20 Domain wall motion layer
27 Domain wall
28 First magnetic domain
29 Second magnetic domain
30 Non-magnetic layer
40 First conductive portion
50 Second conductive portion
60 Substrate
70 Electrode
80 Interlayer insulating film
90, 91 Via wiring
92 Core portion
93 Insulation portion
100, 101 Domain wall motion element
100*a* First element
100*b* Second element
100*c* Third element
200, 201, 202, 203, 204, 205, 206, 304, 305 Product-sum calculator
300 Neuromorphic device
301 Input layer
302 Hidden layer
303 Output layer
D Drain region
Ed1 First end portion
Ed2 Second end portion
ER1 First element array
ER2 Second element array
G Gate electrode
GI Gate insulating film
L1 First distance
L2 Second distance
L3 Third distance
$M_1$, $M_2$, $M_{10}$, $M_{28}$, $M_{29}$, $M_{40}$, $M_{50}$ Magnetization
Ma, Ma1, Ma2, Ma3, Ma4, Ma5, Ma6 Magnetic recording array
Mp Main portion
P, P1 Peripheral circuit
Ps1 First Power supply
Ps2 Second Power supply
S Source region
Tr1 First transistor
Tr2 Second transistor
Tr3 Third transistor
w1 First wiring
w2 Second wiring
w3 Third wiring
wg Gate wiring

What is claimed is:

1. A magnetic recording array comprising:

a plurality of domain wall motion elements and a plurality of wirings, the plurality of domain wall motion elements has a first element array arranged in a first direction and a second element array arranged in a second direction perpendicular to the first direction, each of the plurality of domain wall motion elements including:

a first ferromagnetic layer;

a domain wall motion layer which extends in a direction different from the first direction and the second direction and in which an orientation direction of magnetization in a first end portion and an orientation direction of magnetization in a second end portion are different from each other;

a non-magnetic layer located between the first ferromagnetic layer and the domain wall motion layer;

a first conductive portion facing the first end portion of the domain wall motion layer; and a second conductive portion facing the second end portion of the domain wall motion layer, the second conductive portion being separate from the first conductive portion, the plurality of wirings including:

a first wiring connected over the first ferromagnetic layers of some of the plurality of domain wall motion elements;

a second wiring connected over the first conductive portions of some of the plurality of domain wall motion elements; and a third wiring connected over the second conductive portions of some of the plurality of domain wall motion elements, wherein, the plurality of domain wall motion elements has a first element, a second element and a third element, the second element has the second end portion closest to the first end portion of the first element, the third element has the second end portion closest or second closest to the first end portion of the first element, a first distance between the first end portion of the first element and the second end portion of the second element and a second distance between the first end portion of the first element and the second end portion of the third element are shorter than a third distance between the first end portion of the first element and the first end portion closest to the first end portion of the first element, the domain wall motion layer has a rectangular shape, the first end portion and the second end portion correspond to one end and another end of the rectangular shape respectively, and the first conductive portion and the second conductive portion are different parts that both face the domain wall motion layer, the domain wall motion elements of the magnetic recording array are magnetically stabilized, the first end portion of the first element is magnetized in a first magnetization direction, the second end portion of the second element is magnetized in a second magnetization direction opposite to the first magnetization direction, the second end portion of the third element is magnetized in a magnetization direction different from both the first magnetization direction and the second magnetization direction, magnetic interaction is generated between the first end portion of the first element and the second end portions of the second element and the third element, the first end portion of the first element and the second end portions of the second element and the third element are configured to have mutually different magnetization directions, and a distance between the first end portion of the first element and an end portion having a magnetization direction different from the magnetization direction of the first end portion of the first element is set to be shorter than a distance between the first end portion of the first element and an end portion having the same magnetization direction as the magnetization direction of the first end portion of the first element.

2. The magnetic recording array according to claim 1, wherein at least one of the first conductive portion and the second conductive portion contains a magnetic material.

3. The magnetic recording array according to claim 1, wherein each of the domain wall motion layers is tilted at an angle larger than 0 degrees and smaller than 45 degrees with respect to the first direction, and the number of the domain wall motion elements constituting the first element array is smaller than the number of the domain wall motion elements constituting the second element array.

4. The magnetic recording array according to claim 1, wherein each of the domain wall motion layers is tilted at an angle larger than 45 degrees and smaller than 90 degrees with respect to the first direction, and the number of the domain wall motion elements constituting the first element array is larger than the number of the domain wall motion elements constituting the second element array.

5. The magnetic recording array according to claim 1, further comprising: a first transistor and a second transistor, the first transistor is located between the first ferromagnetic layer of the domain wall motion element and the first wiring; and the second transistor is located between the first conductive portion of the domain wall motion element and the second wiring.

6. The magnetic recording array according to claim 5, further comprising a third transistor which is located between the second conductive portion of the domain wall motion element and the third wiring.

7. The magnetic recording array according to claim 1, wherein the first wiring and the second wiring are parallel to each other.

8. The magnetic recording array according to claim 1, wherein the first wiring and the second wiring intersect each other.

9. A product-sum calculator comprising:

the magnetic recording array according to claim 1;

a sum calculation unit connected to the plurality of domain wall motion elements belonging to the first element array of the magnetic recording array; and a peripheral circuit disposed around the magnetic recording array, wherein the peripheral circuit includes a first power supply connected to the first wiring and a second power supply connected to the second wiring.

10. The product-sum calculator according to claim 9, wherein the peripheral circuit further includes a control unit, the sum calculation unit further includes a detector, the control unit is connected to the detector, and the control unit controls the detector to detect a total current amount of an electric current flowing through the third wiring, which is commonly connected to the first element array, during a period from when a read current is applied to all the domain wall motion elements disposed in the first element array to when the read current is not applied.

11. A neuromorphic device comprising one or a plurality of product-sum calculators according to claim 9.

* * * * *